United States Patent
Lee et al.

(10) Patent No.: US 12,230,330 B2
(45) Date of Patent: *Feb. 18, 2025

(54) NONVOLATILE MEMORY DEVICE FOR INCREASING RELIABILITY OF DATA DETECTED THROUGH PAGE BUFFER

(71) Applicant: Samsung Electronics Co., Ltd., Suwon-si (KR)

(72) Inventors: Myeongwoo Lee, Hwaseong-si (KR); Chaehoon Kim, Gwacheon-si (KR); Jihwan Kim, Suwon-si (KR); Jungho Song, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/143,907

(22) Filed: May 5, 2023

(65) Prior Publication Data
US 2023/0274783 A1 Aug. 31, 2023

Related U.S. Application Data

(63) Continuation of application No. 17/499,533, filed on Oct. 12, 2021, now Pat. No. 11,670,378.

(30) Foreign Application Priority Data

Jan. 29, 2021 (KR) .................. 10-2021-0013173

(51) Int. Cl.
*G11C 16/24* (2006.01)
*G11C 16/04* (2006.01)
(Continued)

(52) U.S. Cl.
CPC .......... *G11C 16/24* (2013.01); *G11C 16/0483* (2013.01); *H01L 24/08* (2013.01);
(Continued)

(58) Field of Classification Search
None
See application file for complete search history.

(56) References Cited

U.S. PATENT DOCUMENTS

| | | | |
|---|---|---|---|
| 6,925,005 B2 | 8/2005 | Kawamura et al. | |
| 7,263,004 B2 | 8/2007 | Chen | |

(Continued)

FOREIGN PATENT DOCUMENTS

| | | |
|---|---|---|
| KR | 1020090026502 A | 3/2009 |
| KR | 1020100020265 A | 2/2010 |

(Continued)

OTHER PUBLICATIONS

Office Action dated Nov. 7, 2024 for corresponding KR Patent Application No. 10-2021-0013173.

*Primary Examiner* — Tan T. Nguyen
(74) *Attorney, Agent, or Firm* — Muir Patent Law, PLLC

(57) ABSTRACT

A nonvolatile memory device includes a memory cell array in a first semiconductor layer and including a first memory cell connected to a first word line and a first bit line and a second memory cell connected to the first word line and a second bit line; a page buffer circuit in a second semiconductor layer and including a first page buffer connected to the first bit line, and a second page buffer connected to the second bit line; and a page buffer controller in the second semiconductor layer. The page buffer controller controls the first and second page buffers so that a develop timing of a first sensing node of the first page buffer is different from a develop timing of a second sensing node of the second page buffer. The first page buffer is closer to a through electrode region than the second page buffer.

20 Claims, 24 Drawing Sheets

(51) Int. Cl.
   *H01L 23/00* (2006.01)
   *H01L 25/065* (2023.01)
   *H01L 25/18* (2023.01)
(52) U.S. Cl.
   CPC .......... *H01L 25/0657* (2013.01); *H01L 25/18* (2013.01); *H01L 2224/08145* (2013.01); *H01L 2225/06541* (2013.01); *H01L 2924/1431* (2013.01); *H01L 2924/14511* (2013.01)

(56) References Cited

U.S. PATENT DOCUMENTS

| | | |
|---|---|---|
| 8,351,273 B2 | 1/2013 | Lee |
| 8,559,233 B2 | 10/2013 | Huh |
| 9,042,175 B2 | 5/2015 | Sim et al. |
| 10,699,788 B2 | 6/2020 | Lee |
| 2006/0291288 A1 | 12/2006 | Kang et al. |
| 2009/0168534 A1 | 7/2009 | Park et al. |
| 2018/0292989 A1* | 10/2018 | Lee .................. G11C 16/32 |
| 2020/0013787 A1 | 1/2020 | Lee et al. |
| 2020/0098436 A1 | 3/2020 | Kim et al. |
| 2021/0375901 A1 | 12/2021 | Oh et al. |
| 2022/0076766 A1* | 3/2022 | Jang ................ G11C 11/5628 |
| 2023/0187396 A1* | 6/2023 | Oh ...................... H01L 25/18 257/777 |

FOREIGN PATENT DOCUMENTS

| | | |
|---|---|---|
| KR | 10-2020-0002070 A | 1/2020 |
| KR | 10-2020-0107024 A | 9/2020 |

\* cited by examiner

NONVOLATILE MEMORY DEVICE FOR INCREASING RELIABILITY OF DATA DETECTED THROUGH PAGE BUFFER

CROSS-REFERENCE TO RELATED APPLICATION

This application is a continuation of and claims priority to U.S. patent application Ser. No. 17/499,533 filed Oct. 12, 2021, which is based on and claims priority under 35 U.S.C. § 119 to Korean Patent Application No. 10-2021-0013173, filed on Jan. 29, 2021, in the Korean Intellectual Property Office, the disclosures of which are incorporated by reference herein in their entirety.

BACKGROUND

The inventive concept relates to a semiconductor device, and more particularly, to a nonvolatile memory device for increasing the reliability of data detected through a page buffer.

Semiconductor memory devices are classified into volatile memory devices, such as static random access memory (SRAM) and dynamic RAM (DRAM), which lose data stored therein when power supply is interrupted, and nonvolatile memory devices, such as phase-change RAM (PRAM), magnetic RAM (MRAM), resistive RAM (RRAM), and ferroelectric RAM (FRAM), which retain data stored therein even after power supply is interrupted.

Nonvolatile memory devices may perform a program operation to store data in a memory cell and a read operation to output data stored in a memory cell. Nonvolatile memory devices may perform a program verify operation to check whether a program operation has been normally performed.

Nonvolatile memory devices may detect data stored in a memory cell through a page buffer in a read operation or a program verify operation. In this case, the reliability of the data detected through the page buffer may be degraded according to a sensing node voltage of an adjacent page buffer.

SUMMARY

The inventive concept provides a nonvolatile memory device for increasing the reliability of data detected through a page buffer in a read operation or a program verify operation.

According to an aspect of the inventive concept, there is provided a nonvolatile memory device including a memory cell array formed in a first semiconductor layer and including a first memory cell and a second memory cell, the first memory cell being connected to a first word line and a first bit line, and the second memory cell being connected to the first word line and a second bit line; a page buffer circuit formed in a second semiconductor layer located below the first semiconductor layer in a first direction, the page buffer circuit including a first page buffer and a second page buffer, the first page buffer being connected to the first bit line through a first through electrode passing through the first semiconductor layer and the second semiconductor layer in the first direction, and the second page buffer being connected to the second bit line through a second through electrode passing through the first semiconductor layer and the second semiconductor layer in the first direction; and a page buffer controller formed in the second semiconductor layer and configured to control the first page buffer and the second page buffer to respectively detect data values respectively stored in the first memory cell and the second memory cell, wherein a develop timing of a first sensing node of the first page buffer is different from a develop timing of a second sensing node of the second page buffer, wherein the first page buffer is closer to a through electrode region of the second semiconductor layer than the second page buffer, the through electrode region having the first through electrode and the second through electrode provided therein.

According to another aspect of the inventive concept, there is provided a nonvolatile memory device including a memory cell array formed in a first semiconductor layer and including a plurality of memory cells connected in common to a first word line and respectively connected to bit lines; page buffers formed in a second semiconductor layer located below the first semiconductor layer in a first direction, the page buffers being respectively connected to the bit lines via through electrodes passing through the first semiconductor layer and the second semiconductor layer in the first direction; and a page buffer controller formed in the second semiconductor layer and configured to control the page buffers, based on different control timings, to respectively detect data values respectively stored in the plurality of memory cells, wherein the page buffers are arranged in a line in a second direction perpendicular to the first direction with respect to a through electrode region of the second semiconductor layer, the through electrode region having the through electrodes provided therein.

According to a further aspect of the inventive concept, there is provided a nonvolatile memory device including a memory cell array including a first memory cell and a second memory cell, the first and second memory cells being connected to a first word line; a page buffer circuit including a first page buffer and a second page buffer, the first page buffer being connected to the first memory cell through a first bit line, and the second page buffer being connected to the second memory cell through a second bit line; and a page buffer controller configured to control the first page buffer and the second page buffer to respectively detect data values respectively stored in the first memory cell and the second memory cell, wherein a develop timing of a first sensing node of the first page buffer is different from a develop timing of a second sensing node of the second page buffer, wherein the first page buffer is closer to the memory cell array than the second page buffer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Embodiments will be clearly described in detail hereinafter so as to be easily implemented by one of ordinary skill in the art of the inventive concept.

Figure 1:
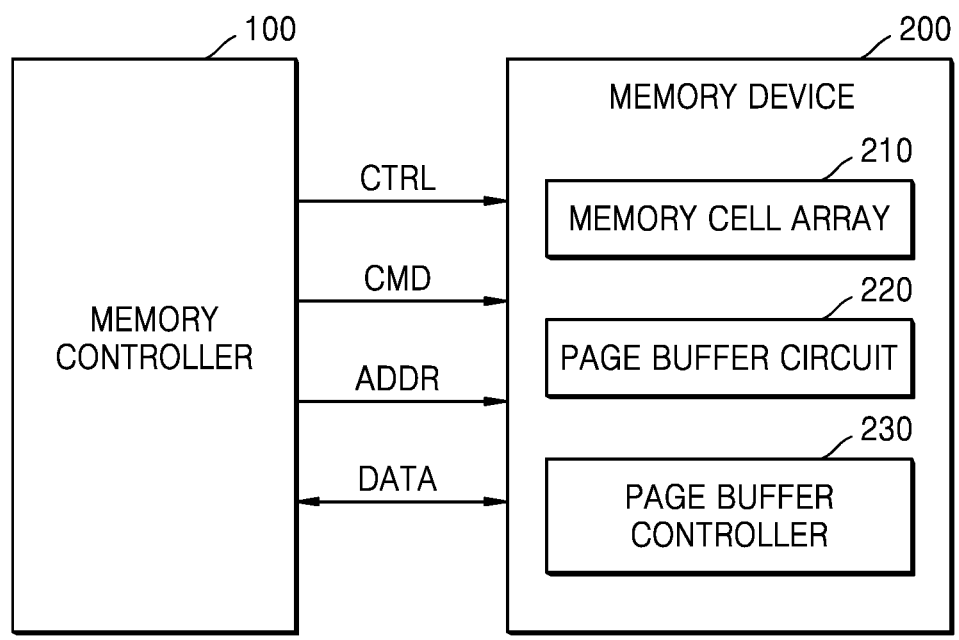
FIG. 1 is a block diagram of a memory system according to an embodiment.

FIG. 1 is a block diagram of a memory system according to an embodiment. Referring to FIG. 1, a memory system 10 may include a memory controller 100 and a memory device 200. The memory system 10 may be included in or mounted on electronic devices such as a personal computer (PC), a server, a data center, a smartphone, a tablet PC, an autonomous vehicle, a handheld game console, and a wearable device. For example, the memory system 10 may include a storage device such as a solid state drive (SSD).

The memory controller 100 may generally control operations of the memory device 200. In detail, the memory controller 100 may provide a control signal CTRL, a command CMD, and/or an address ADDR to the memory device 200 to control the memory device 200. In an example embodiment, the memory controller 100 may control the memory device 200 to store data DATA or output the data DATA in response to a request from an external host.

The memory device 200 may operate under the control of the memory controller 100. In an example embodiment, the memory device 200 may output the data DATA stored therein or store the data DATA provided from the memory controller 100, under the control of the memory controller 100.

The memory device 200 may include a memory cell array 210, a page buffer circuit 220, and a page buffer controller 230. The memory cell array 210 may include a plurality of memory cells connected to word lines and bit lines. A row address in the address ADDR may indicate at least one word line, and a column address in the address ADDR may indicate at least one bit line.

For example, the memory cells may include flash memory cells. However, embodiments are not limited thereto, and the memory cells may include a resistive random access memory (RRAM) cell, a ferroelectric RAM (FRAM) cell, a phase-change RAM (PRAM) cell, a thyristor RAM (TRAM) cell, a magnetic RAM (MRAM) cell, and a dynamic RAM (DRAM) cell. Hereinafter, descriptions will be focused on embodiments in which the memory cells include NAND flash memory cells.

The page buffer circuit 220 may include a plurality of page buffers. Each of the page buffers may be connected to memory cells of the memory cell array through a corresponding bit line. Each of the page buffers may operate as a write driver or a sense amplifier. For example, in a program operation, a page buffer may apply a voltage, which corresponds to the data DATA to be programmed, to a bit line such that the data DATA may be stored in a memory cell. In a program verify operation or a read operation, a page buffer may detect the data DATA that has been programmed by sensing a current or a voltage through a bit line.

The page buffer controller 230 may control operations of the page buffer circuit 220. The page buffer controller 230 may control a page buffer using various control signals. For example, the page buffer circuit 220 may detect the data DATA stored in memory cells based on the control signals of the page buffer controller 230.

In an example embodiment, the page buffer controller 230 may control page buffers based on different control timings. For example, the page buffer controller 230 may control page buffers such that a precharge timing of a first sensing node of a first page buffer is different from a precharge timing of a second sensing node of a second page buffer. The page buffer controller 230 may control the page buffers such that a develop timing of the first sensing node is different from a develop timing of the second sensing node. When adjacent page buffers are controlled based on different control timings in a read operation or a program verify operation, the influence of the voltage change of a sensing node of an adjacent page buffer may be reduced. Accordingly, the reliability of data detected through a page buffer may be increased.

Figure 2:
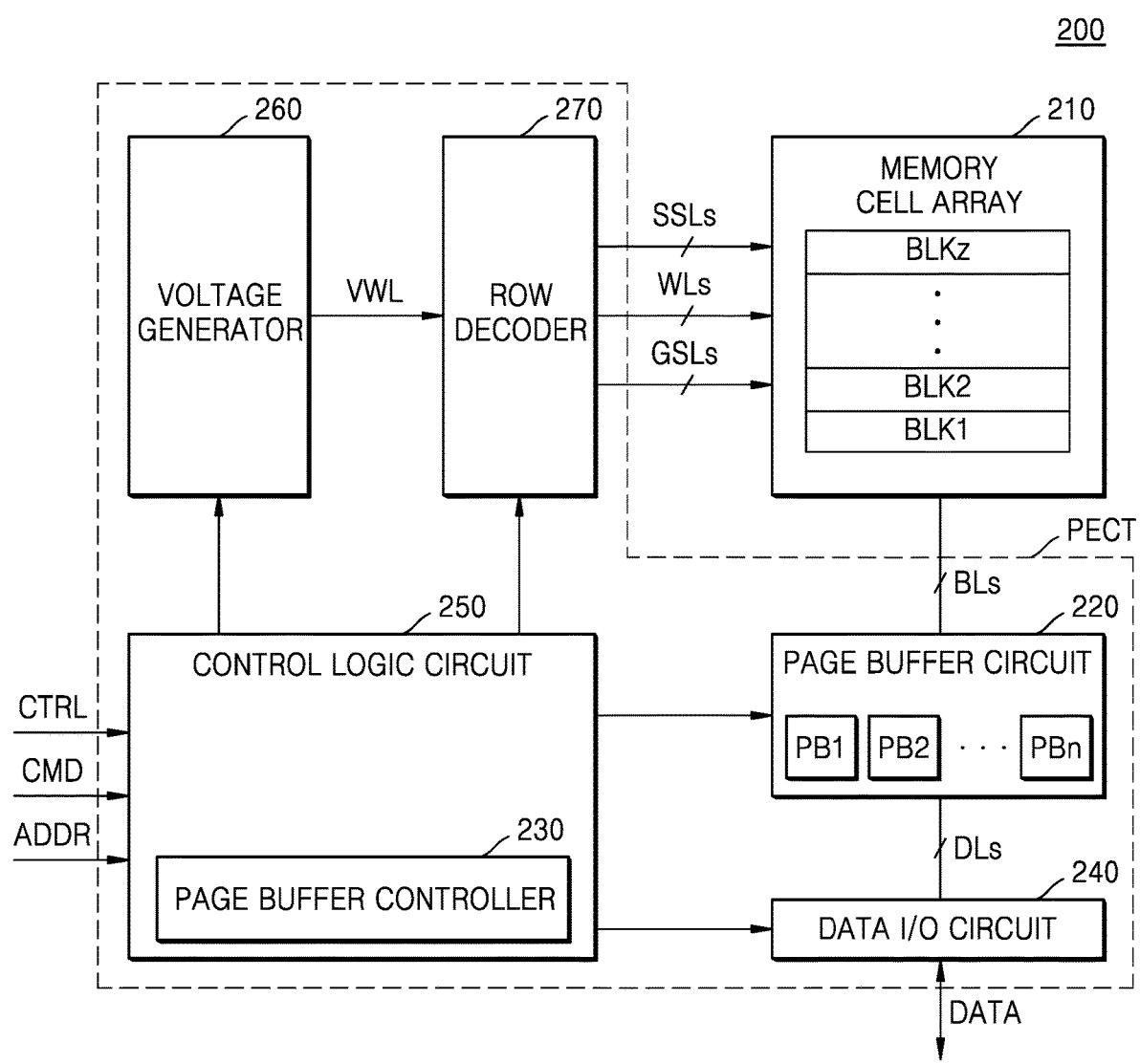
FIG. 2 is a block diagram of an example of a memory device in FIG. 1.

FIG. 2 is a block diagram of an example of a memory device in FIG. 1. Referring to FIG. 2, the memory device 200 may include the memory cell array 210, the page buffer circuit 220, a data input/output (I/O) circuit 240, a control logic circuit 250, a voltage generator 260, and a row decoder 270. In this specification, the page buffer circuit 220, the data I/O circuit 240, the control logic circuit 250, the voltage generator 260, and the row decoder 270 may be referred to as peripheral circuits PECT.

The memory cell array 210 may include a plurality of memory blocks BLK1 through BLKz (where "z" is a positive integer). Each of the memory blocks BLK1 through BLKz may include a plurality of memory cells. The memory cell array 210 may be connected to the page buffer circuit 220 through bit lines BLs and connected to the row decoder 270 through word lines WLs, string selection lines SSLs, and ground selection lines GSLs.

In an example embodiment, the memory cell array 210 may include a three-dimensional (3D) memory cell array, which may include a plurality of NAND strings. Each of the NAND strings may include memory cells respectively connected to word lines vertically stacked on a substrate. The disclosures of U.S. Pat. Nos. 7,679,133, 8,553,466, 8,654, 587, 8,559,235, and U.S. Patent Application No. 2011/0233648 are incorporated herein by reference in their entirety. Any incorporation by reference of documents above is limited such that no subject matter is incorporated that is contrary to the explicit disclosure herein. In an example embodiment, the memory cell array 210 may include a two-dimensional (2D) memory cell array, which may include a plurality of NAND strings in row and column directions.

The page buffer circuit 220 may include a plurality of page buffers, e.g., first through n-th page buffers PB1 through PBn, which may be connected to memory cells through the bit lines BLs, respectively. The page buffer circuit 220 may select at least one of the bit lines BLs under the control of the control logic circuit 250. For example, during a program operation, the page buffer circuit 220 may apply a program bit line voltage, which corresponds to the data DATA to be programmed, to a selected bit line. In a read operation, the page buffer circuit 220 may detect the data DATA stored in a memory cell by sensing a current or a voltage of a selected bit line. The page buffer circuit 220 may be configured to temporarily store the data DATA to be programmed or the data DATA that has been read from a memory cell.

The data I/O circuit 240 may provide the data DATA from the memory controller 100 to the page buffer circuit 220 through data lines DLs or provide the data DATA from the page buffer circuit 220 to the memory controller 100 through the data lines DLs.

The control logic circuit 250 may generally control operations of the memory device 200. For example, the control logic circuit 250 may control each element of the memory device 200 based on the command CMD, the address ADDR, and/or the control signal CTRL such that the memory device 200 performs various operations (e.g., a program operation, a read operation, and erase operation).

The control logic circuit 250 may include the page buffer controller 230. The page buffer controller 230 may generate control signals for controlling each of the first through n-th page buffers PB1 through PBn. In an example embodiment, the page buffer controller 230 may generate control signals such that adjacent page buffers are controlled based on different control timings. For example, respective sensing nodes of page buffers may have different precharge timings or different develop timings based on the control signals. Control signals generated based on different control timings will be described in detail with reference to FIGS. 8A through 14B.

The voltage generator 260 may generate various voltages for performing program, read, and erase operations based on a control signal from the control logic circuit 250. For example, the voltage generator 260 may generate a program voltage, a read voltage, and a program verify voltage as word line voltages VWL.

The row decoder 270 may select one of the word lines WLs and one of the string selection lines SSLs in response to a control signal (e.g., a row address). For example, the row decoder 270 may apply a program voltage and a program verify voltage to a selected word line during a program operation and may apply a read voltage to a selected word line during a read operation.

Figure 3:
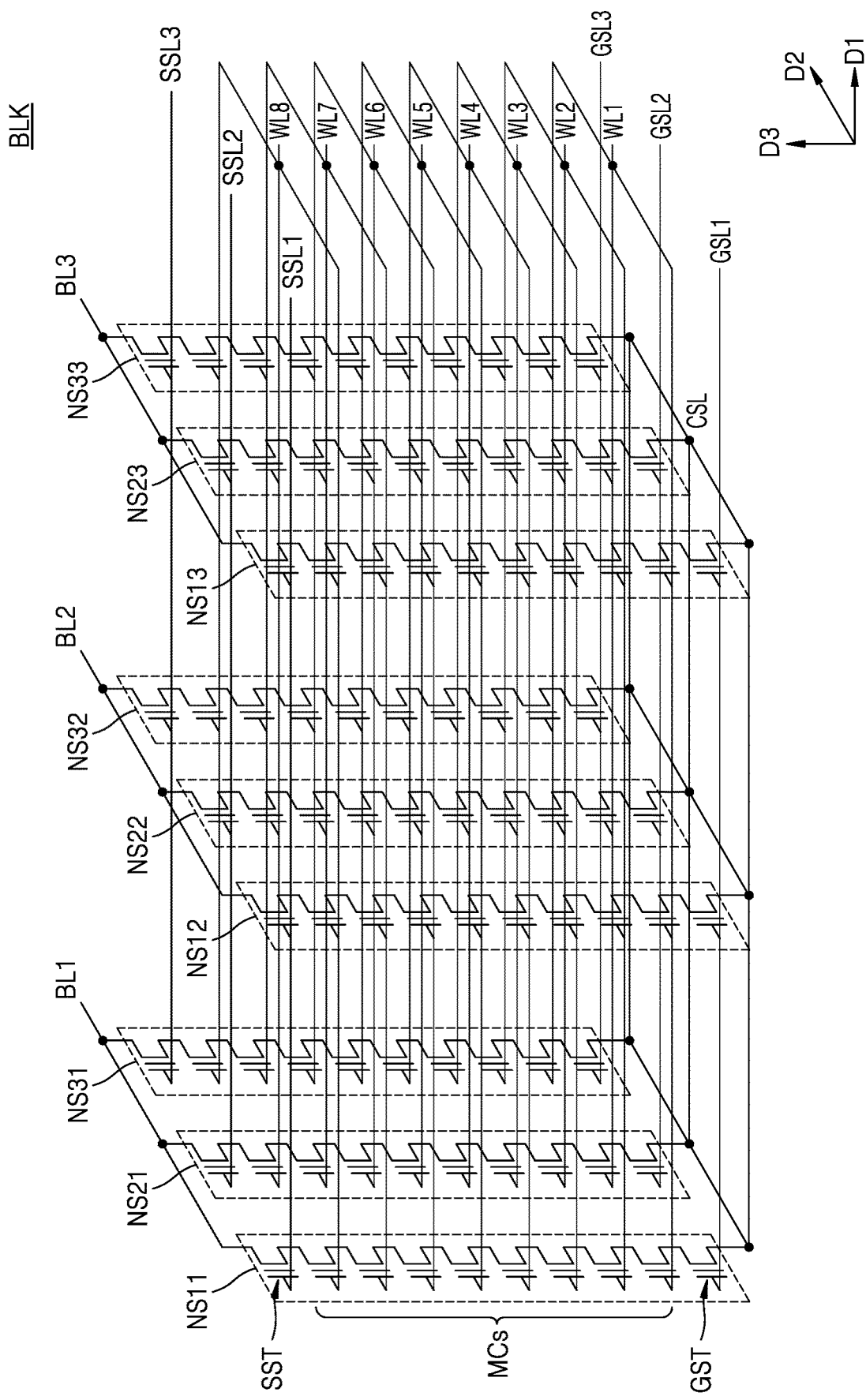
FIG. 3 is a circuit diagram of a memory block according to an embodiment.

FIG. 3 is a circuit diagram of a memory block according to an embodiment. Referring to FIG. 3, a memory block BLK may correspond to one of the memory blocks BLK1 through BLKz in FIG. 2. The memory block BLK may include NAND strings NS11 through NS33, of which each (e.g., NS11) may include a string selection transistor SST, a plurality of memory cells MCs, and a ground selection transistor GST, which are connected in series to one another. The transistors, e.g., the string selection transistor SST and the ground selection transistor GST, and the memory cells MCs included in each NAND string may form a stack structure on a substrate in a third direction D3 (i.e., a vertical direction).

First through eighth word lines WL1 through WL8 may extend in a first direction D1 perpendicular to the third direction D3, and first through third bit lines BL1 through BL3 may extend in a second direction D2 perpendicular to the first direction D1 and the third direction D3. The NAND strings NS11, NS21, and NS31 may be between the first bit line BL1 and a common source line CSL; the NAND strings NS12, NS22, and NS32 may be between the second bit line BL2 and the common source line CSL; and the NAND strings NS13, NS23, and NS33 may be between the third bit line BL3 and the common source line CSL. The string selection transistor SST may be connected to a corresponding one of string selection lines SSL1 through SSL3. Each of the memory cells MCs may be connected to a corresponding one of the first through eighth word lines WL through WL8. The ground selection transistor GST may be connected to a corresponding one of ground selection lines GSL1 through GSL3. The string selection transistor SST may be connected to a corresponding one of the first through third bit lines BL1 through BL3, and the ground selection transistor GST may be connected to the common source line CSL. Here, the numbers of NAND strings, word lines, bit lines, ground selection lines, and string selection lines may vary with embodiments.

Figure 4:
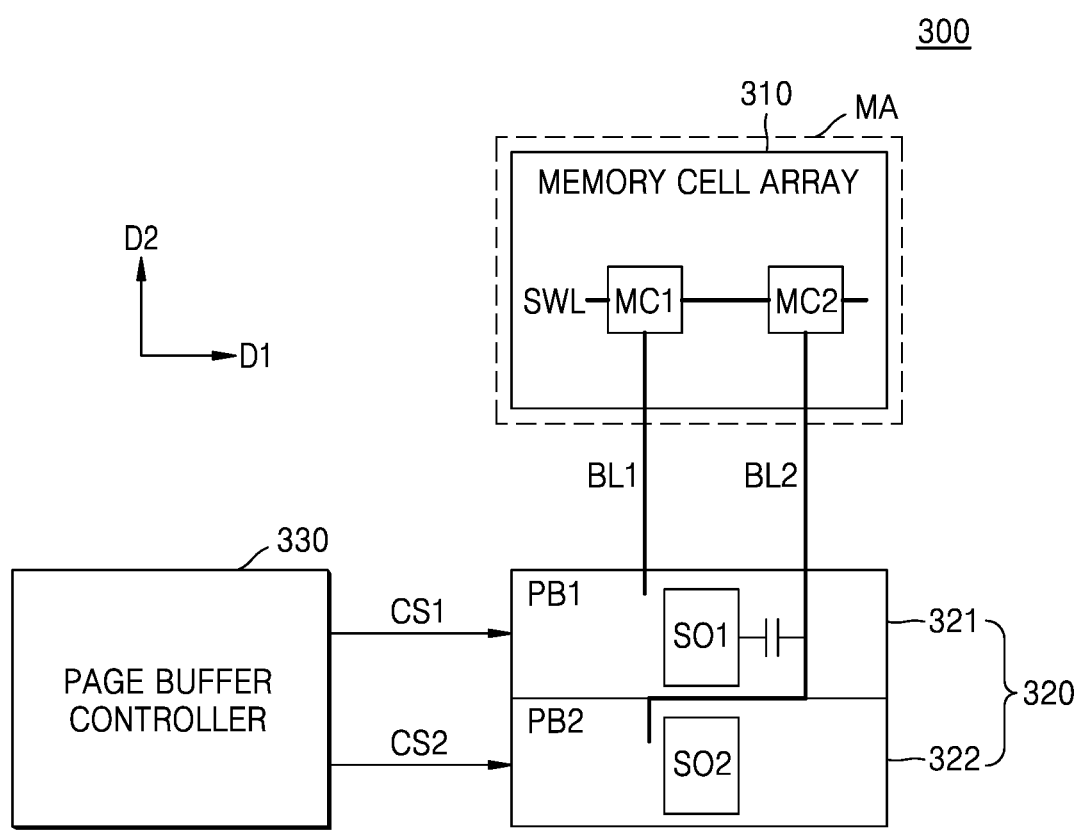
FIG. 4 is a block diagram of an example of the memory device in FIG. 1.

FIG. 4 is a block diagram of an example of the memory device in FIG. 1. Referring to FIG. 4, a memory device 300 may include a memory cell array 310, a page buffer circuit 320 including a first page buffer 321 and a second page buffer 322, and a page buffer controller 330. The memory cell array 310, the page buffer circuit 320, and the page buffer controller 330 may respectively correspond to the memory cell array 210, the page buffer circuit 220, and the page buffer controller 230 in FIG. 1.

The memory cell array 310 may include a plurality of memory cells including a first memory cell MC1 and a second memory cell MC2. The first memory cell MC1 and the second memory cell MC2 may be connected to a selected (e.g., "a first") word line SWL among a plurality of word lines. The memory cell array 310 may be in a memory cell area MA.

The first page buffer 321 may be connected to the first memory cell MC1 through the first bit line BL1. For example, an end of the first bit line BL1 may be connected to a NAND string including the first memory cell MC1, and the other end of the first bit line BL1 may be connected to a transistor of the first page buffer 321. The second page buffer 322 may be connected to the second memory cell MC2 through the second bit line BL2. For example, an end of the second bit line BL2 may be connected to a NAND string including the second memory cell MC2, and the other end of the second bit line BL2 may be connected to a transistor of the second page buffer 322.

The first page buffer 321 may detect data of the first memory cell MC1 through the first bit line BL1. For example, the first page buffer 321 may perform a precharge operation. In this case, a first sensing node SO1 may be precharged. The first page buffer 321 may perform a develop operation after performing the precharge operation. In this case, a voltage of the first sensing node SO1 that has been precharged may be changed based on data stored in the first memory cell MC1. For example, during the develop operation, a voltage level of the first sensing node SO1 may maintain, decrease, or increase based on a threshold voltage of the first memory cell MC1. Accordingly, the first page buffer 321 may detect data stored in the first memory cell MC1.

The second page buffer 322 may detect data of the second memory cell MC2 through the second bit line BL2. For example, the second page buffer 322 may perform a precharge operation. In this case, a second sensing node SO2 may be precharged. The second page buffer 322 may perform a develop operation after performing the precharge operation. In this case, a voltage of the second sensing node SO2 that has been precharged may be changed based on data stored in the second memory cell MC2. For example, during the develop operation, a voltage level of the second sensing node SO2 may maintain, decrease, or increase based on a threshold voltage of the second memory cell MC2. Accordingly, the second page buffer 322 may detect data stored in the second memory cell MC2.

The first page buffer 321 and the second page buffer 322 may be arranged in a line in a direction (i.e., the second direction D2), in which the first and second bit lines BL1 and BL2 extend. For example, each of the first page buffer 321 and the second page buffer 322 may include a plurality of transistors, which may be arranged in a line in the second direction D2. For example, the second page buffer 322 may be below the first page buffer 321 in the second direction D2. Accordingly, the first page buffer 321 may be more adjacent to the memory cell area MA than the second page buffer 322. In other words, a distance from the first page buffer 321 to the memory cell area MA may be less than a distance from the second page buffer 322 to the memory cell area MA.

When the first page buffer 321 and the second page buffer 322 are arranged as shown in FIG. 4, the second bit line BL2 may be adjacent to the first sensing node SO1 of the first page buffer 321. In this case, coupling may occur due to capacitance f between the first sensing node SO1 and the second bit line BL2. In an example embodiment, the voltage of the second bit line BL2 may be changed by coupling resulting from the voltage change of the first sensing node SO1. For example, when the voltage of the first sensing node SO1 is changed according to the develop operation of the first page buffer 321, the voltage of the second bit line BL2 may also be changed. The voltage of the second sensing node SO2 may be changed according to the voltage change of the second bit line BL2. Because a value of data may be determined based on the voltage of the second sensing node SO2, the reliability of data detected based on the voltage of the second sensing node SO2 may be degraded.

The page buffer controller 330 may control the first page buffer 321 based on first control signals CS1. For example, the page buffer controller 330 may provide the first control signals CS1 to the first page buffer 321 such that the first page buffer 321 detects data stored in the first memory cell MC1. The page buffer controller 330 may control the second page buffer 322 based on second control signals CS2. For example, the page buffer controller 330 may provide the second control signals CS2 to the second page buffer 322 such that the second page buffer 322 detects data stored in the second memory cell MC2.

In an example embodiment, the page buffer controller 330 may control the first page buffer 321 and the second page buffer 322 based on different control timings. For example, the page buffer controller 330 may generate the first control signals CS1 and the second control signals CS2 such that precharge timings and develop timings of the first and second sensing nodes SO1 and SO2 are different from one another. The page buffer controller 330 may adjust the control timings of the first page buffer 321 and the second page buffer 322 to reduce the degradation of data reliability caused by coupling between the first sensing node SO1 and the second bit line BL2. Accordingly, even when the voltage of the second bit line BL2 is changed by coupling between the first sensing node SO1 and the second bit line BL2, the reliability of data detected from the second page buffer 322 may be maintained.

Although it is illustrated in FIG. 4 that two page buffers, i.e., the first and second page buffers 321 and 322, are arranged in a line, embodiments are not limited thereto. For example, at least three page buffers may be arranged in a line in the second direction D2, and the page buffer controller 330 may control the page buffers based on different control timings. Hereinafter, for convenience of description, embodiments will be described based on two page buffers.

Figure 5:
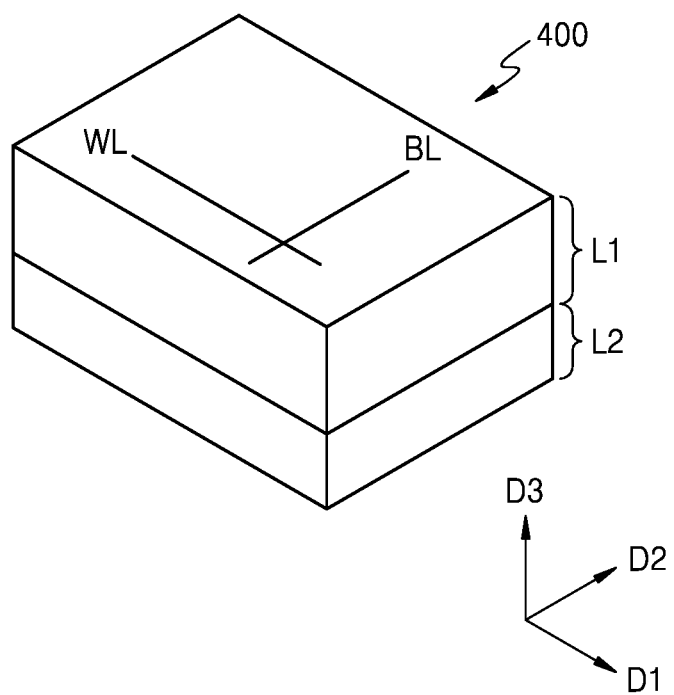
FIG. 5 illustrates an example structure of the memory device of FIG. 1.

FIG. 5 illustrates an example structure of the memory device of FIG. 1. Referring to FIG. 5, a memory device 400 may include a first semiconductor layer L1 and a second semiconductor layer L2. The first semiconductor layer L1 may be stacked on the second semiconductor layer L2 in the vertical direction (i.e., the third direction D3). In detail, the second semiconductor layer L2 may be below the first semiconductor layer L1 in the third direction D3.

In an example embodiment, the memory cell array 210 in FIG. 2 may be formed in the first semiconductor layer L1, and the peripheral circuits PECT in FIG. 2 may be formed in the second semiconductor layer L2. Accordingly, the memory device 400 may have a cell over periphery (COP) structure, in which the memory cell array 210 is above the peripheral circuits PECT. According to the COP structure, an area in a horizontal direction (i.e., in the first and second directions D1 and D2) may be effectively reduced, and the integration density of the memory device 400 may be increased.

In an example embodiment, the second semiconductor layer L2 may include a substrate. The peripheral circuits PECT may be formed in the second semiconductor layer L2 by forming transistors (e.g., transistors TR in FIG. 6) and metal patterns (e.g., first through third lower conductive lines PM1, PM2, and PM3 in FIG. 6) for the wiring of the transistors on the substrate. After the peripheral circuits PECT are formed in the second semiconductor layer L2, the first semiconductor layer L1 including the memory cell array 210 may be formed. Metal patterns, which electrically connect word lines WL and bit lines BL of the memory cell array 210 to the peripheral circuits PECT in the second semiconductor layer L2, may be formed. For example, the word lines WL may extend in the first direction D1, and the bit lines BL may extend in the second direction D2.

The memory device 400 may have the COP structure as described above, but embodiments are not limited thereto. For example, the memory device 400 may have a chip-to-chip (C2C) structure. In this case, the first semiconductor layer L1 may correspond to an upper chip, and the second semiconductor layer L2 may correspond to a lower chip. In the C2C structure, the first semiconductor layer L1 may include the memory cell array 210 in FIG. 2 on a first wafer, and the second semiconductor layer L2 may include the peripheral circuits PECT in FIG. 2 on a second wafer. The first semiconductor layer L1 may be connected to the second semiconductor layer L2 using a bonding method. For example, a bonding metal (e.g., an upper bonding metal 572c in FIG. 15) formed in a top metal layer of the first semiconductor layer L1 may be electrically connected to a bonding metal (e.g., a lower bonding metal 672c in FIG. 15) formed in a top metal layer of the second semiconductor layer L2. For example, when a bonding metal includes copper (Cu), the bonding method may include a Cu—Cu bonding method. For example, the first semiconductor layer L1 and the second semiconductor layer L2 may be stacked in a wafer level. For example, the first semiconductor layer L1 and the second semiconductor layer L2 may be stacked in a chip level.

Figure 6:
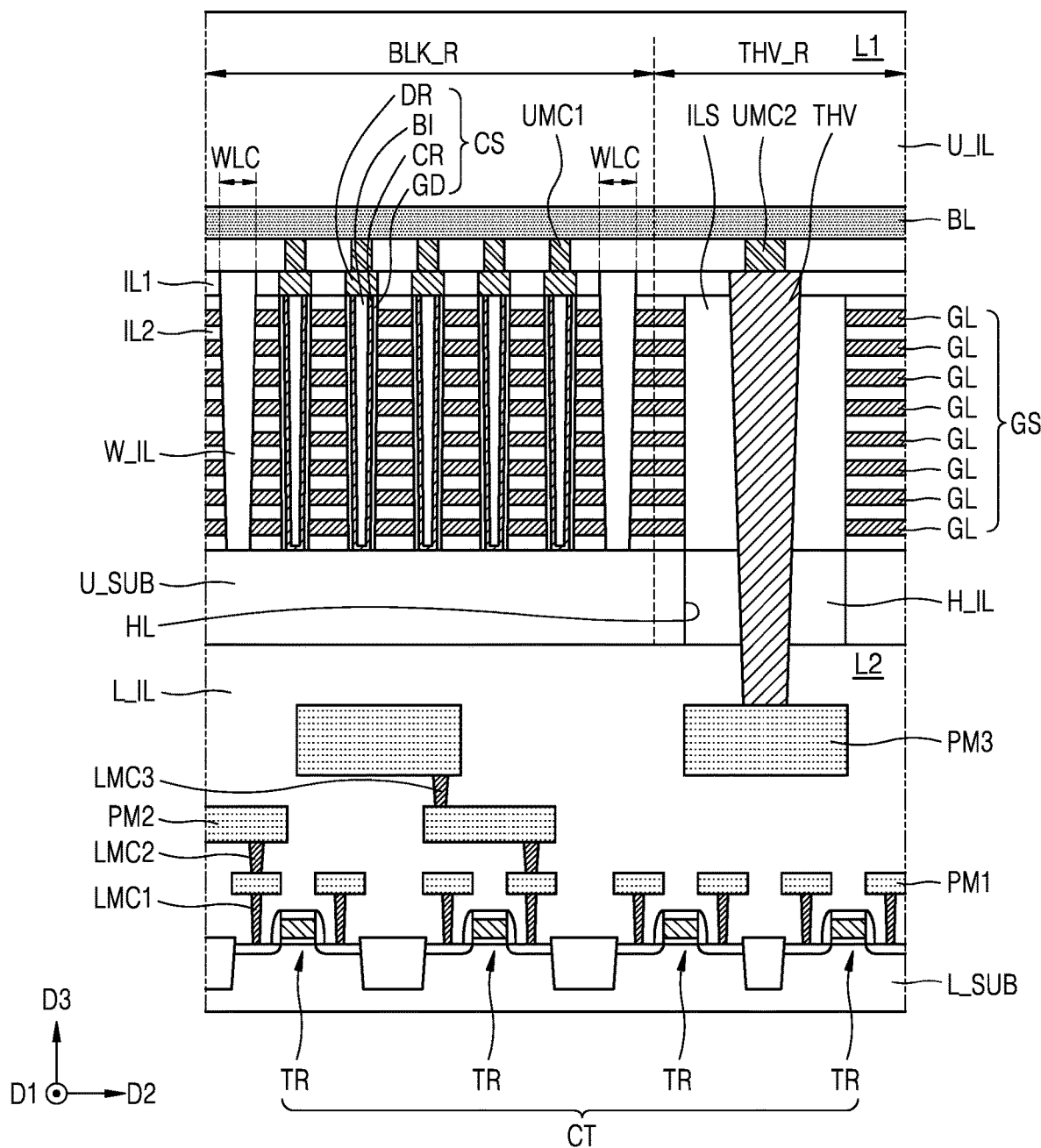
FIG. 6 is an example cross-sectional view of a memory device of FIG. 5.

FIG. 6 is an example cross-sectional view of the memory device of FIG. 5. In detail, FIG. 6 shows a cross-sectional view of the memory device 400 having a COP structure. Referring to FIG. 6, the second semiconductor layer L2 may include a lower substrate L_SUB and circuits CT formed in the lower substrate L_SUB. The circuits CT may include at least one transistor TR. The circuits CT may include the page buffer circuit 220 and the page buffer controller 230, which have been described above.

The second semiconductor layer L2 may further include lower contacts LMC1, LMC2, and LMC3, which are electrically connected to the circuits CT, and the first through third lower conductive lines PM1, PM2, and PM3, which are electrically connected to the lower contacts LMC1, LMC2, and LMC3. The circuits CT, the lower contacts LMC1, LMC2, and LMC3, and the first through third lower conductive lines PM1, PM2, and PM3 may be covered with a lower insulating layer L_IL.

The first semiconductor layer L1 may include an upper substrate U_SUB and a plurality of channel structures CS on the upper substrate U_SUB. The channel structures CS may extend through gate conductive layers GS in the vertical direction (i.e., the third direction D3). The channel structures CS may be separated from one another at a certain distance in the first and second directions D1 and D2. Each of the channel structures CS may include a gate dielectric film GD, a channel region CR, a buried insulating film BI, and a drain region DR. The gate dielectric film GD may include a tunneling dielectric film, a charge storage film, and a blocking dielectric film, which are sequentially formed on the channel region CR. The channel region CR may include doped polysilicon or undoped polysilicon. The channel region CR may have a cylindrical shape. The inner space of the channel region CR may be filled with the buried insulating film BI. The buried insulating film BI may include an insulating material. In some embodiments, the buried insulating film BI may be omitted. In this case, the channel region CR may have a pillar shape without an inner space. The drain region DR may include a doped polysilicon film. The drain region DR may be electrically connected to a bit line BL through a first upper contact UMC1. A plurality of drain regions DR of the channel structures CS may be insulated from each other by a first insulating film IL1.

The first semiconductor layer L1 may further include first upper contacts UMC1 electrically connected to the channel structures CS, a second upper contact UMC2 electrically connected to a through electrode or through-hole-via THV, and the bit line BL. The channel structures CS and the bit line BL may be covered with an upper insulating layer U_IL.

The through electrode THV may extend through the gate conductive layers GS in the vertical direction (i.e., the third direction D3). The through electrode THV may pass through the upper substrate U_SUB through a through hole HL. The through electrode THV may extend to a portion of the second semiconductor layer L2 in the vertical direction (i.e., the third direction D3). The through electrode THV may be surrounded by the first insulating film IL1 and an insulating structure ILS and surrounded by a buried insulating film H_IL in the through hole HL. The through electrode THV may include an end connected to the bit line BL through the second upper contact UMC2 and an opposite end connected to the third lower conductive line PM3. Accordingly, the bit line BL of the first semiconductor layer L1 may be electrically connected to the circuits CT of the second semiconductor layer L2 through the through electrode THV. For example, each page buffer of the page buffer circuit 220 in the second semiconductor layer L2 may be connected to the bit line BL through the through electrode THV.

The channel structures CS may be in a block region BLK_R, and the through electrode THV may be in a through electrode region THV_R. The block region BLK_R may be separated from the through electrode region THV_R by a plurality of word line cut regions WLC, which extend on the upper substrate U_SUB in the first and second directions D1 and D2. The word line cut regions WLC may be filled with an insulating film W_IL.

The gate conductive layers GS may include a plurality of gate lines GL extending in the second direction D2 to be parallel with each other. For example, the gate lines GL may form a ground selection line, word lines, and a string selection line. For example, the ground selection line, the word lines, and the string selection line may be sequentially formed on the upper substrate U_SUB, as described above with reference to FIG. 3. A second insulating film IL2 may be formed between gate lines GL. For example, the ground selection line and a portion of a channel structure CS adjacent to the ground selection line may form the ground selection transistor GST in FIG. 3. The word lines and a portion of the channel structure CS adjacent to the words lines may form the memory cells MCs in FIG. 3. The string selection line and a portion of the channel structure CS adjacent to the string selection line may form the string selection transistor SST in FIG. 3.

In an example embodiment, the channel structures CS in the block region BLK_R may form the memory cell array 210 described above. In this case, the circuits CT in a region (i.e., a region below the block region BLK_R in the third direction D3) of the second semiconductor layer L2 corresponding to the block region BLK_R of the first semiconductor layer L1 may form the page buffer circuit 220. Page buffers of the page buffer circuit 220 may be arranged in a line in the second direction D2.

As described above, in the memory device 400 having the COP structure, the bit line BL may be connected to a page buffer through the through electrode THV, which is formed in the through electrode region THV_R of the first and second semiconductor layers L1 and L2.

Figure 7:
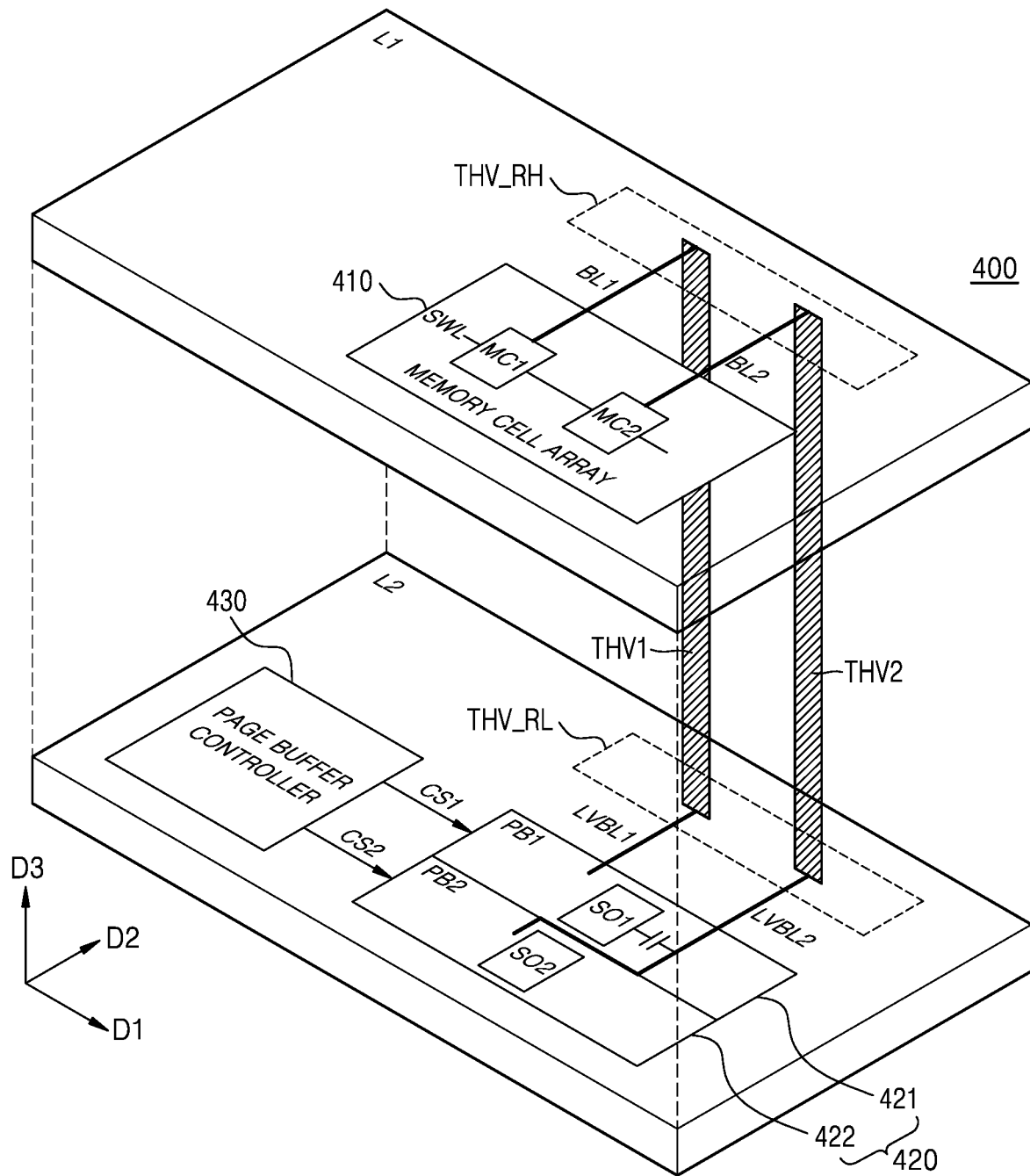
FIG. 7 is a diagram of an example of the memory device of FIG. 5.

FIG. 7 is a diagram of an example of the memory device of FIG. 5. Referring to FIG. 7, the memory device 400 may include a memory cell array 410, a page buffer circuit 420 including a first page buffer 421 and a second page buffer 422, and a page buffer controller 430. The memory cell array 410 may be formed in the first semiconductor layer L1, and the page buffer circuit 420 and the page buffer controller 430 may be formed in the second semiconductor layer L2. The memory cell array 410, the page buffer circuit 420, and the page buffer controller 430 may respectively correspond to the memory cell array 210, the page buffer circuit 220, and the page buffer controller 230 in FIG. 1.

The memory cell array 410 may include a plurality of memory cells including the first memory cell MC1 and the second memory cell MC2. The first memory cell MC1 and the second memory cell MC2 may be connected to the selected word line SWL among a plurality of word lines. The first memory cell MC1 and the second memory cell MC2 may be respectively connected to the first bit line BL1 and the second bit line BL2, which are formed in the first semiconductor layer L1.

The first page buffer 421 and the second page buffer 422 may be respectively connected to a first lower bit line LVBL1 and a second lower bit line LVBL2, which are formed in the second semiconductor layer L2. The first bit line BL1 may be electrically connected to the first lower bit line LVBL1 through a first through electrode THV1, and the second bit line BL2 may be electrically connected to the second lower bit line LVBL2 through a second through electrode THV2. An end of the first through electrode THV1 and an end of the second through electrode THV2 may be in a through electrode region THV_RH of the first semiconductor layer L1, and the other end of the first through electrode THV1 and the other end of the second through electrode THV2 may be in a through electrode region THV_RL of the second semiconductor layer L2.

The first page buffer 421 may detect data, which is stored in the first memory cell MC1, through the first bit line BL1 and the first lower bit line LVBL1, which are electrically connected by the first through electrode THV1. For example, the first page buffer 421 may detect the data of the first memory cell MC1 by performing a precharge operation and a develop operation. The second page buffer 422 may detect data, which is stored in the second memory cell MC2, through the second bit line BL2 and the second lower bit line LVBL2, which are electrically connected by the second through electrode THV2. For example, the second page buffer 422 may detect the data of the second memory cell MC2 by performing a precharge operation and a develop operation.

The first page buffer 421 and the second page buffer 422 may be arranged in a line in a direction (i.e., the second direction D2), in which the first and second lower bit lines LVBL1 and LVBL2 extend. For example, as described above with reference to FIG. 6, each of the first page buffer 421 and the second page buffer 422 may include a plurality of transistors TR, which may be arranged in a line in the second direction D2. Accordingly, the first page buffer 421 may be more adjacent (i.e., closer in proximity) to the through electrode region THV_RL than the second page buffer 422.

When the first page buffer 421 and the second page buffer 422 are arranged as shown in FIG. 7, the second lower bit line LVBL2 may be adjacent to the first sensing node SO1 of the first page buffer 421. Due to the proximity of the second lower bit line LVBL2 to the first sensing node SO1, as described above with reference to FIG. 4, the voltage of the second lower bit line LVBL2 may be changed by coupling resulting from the voltage change of the first sensing node SO1, and the voltage of the second sensing node SO2 may also be changed according to the voltage change of the second lower bit line LVBL2. As a result, the reliability of data detected based on the voltage of the second sensing node SO2 may be degraded.

The page buffer controller 430 may control the first page buffer 421 based on the first control signals CS1. The page buffer controller 430 may control the second page buffer 422 based on the second control signals CS2. The page buffer controller 430 may control the first page buffer 421 and the second page buffer 422 based on different control timings. For example, the page buffer controller 430 may adjust the control timings of the first page buffer 421 and the second page buffer 422 to reduce the degradation of data reliability caused by coupling between the first sensing node SO1 and the second lower bit line LVBL2. Accordingly, the reliability of data detected from the second page buffer 422 may be maintained.

FIGS. 8A through 8D illustrate data detection operations according to embodiments. In detail, FIGS. 8A through 8D show examples of controlling the first sensing node SO1 and the second sensing node SO2 based on different control timings, as described above with reference to FIGS. 4 through 7. In this case, the first sensing node SO1 may be included in a page buffer (e.g., the first page buffer 321 or 421) at a first distance from the memory cell area MA or the through electrode region THV_RL, and the second sensing node SO2 may be included in a page buffer (e.g., the second page buffer 322 or 422) at a second distance (the second distance being greater than the first distance) from the memory cell area MA or the through electrode region THV_RL. Referring to FIGS. 8A through 8D, a data detection operation may be performed through a precharge operation, a develop operation, and a sensing operation.

Figure 8A:
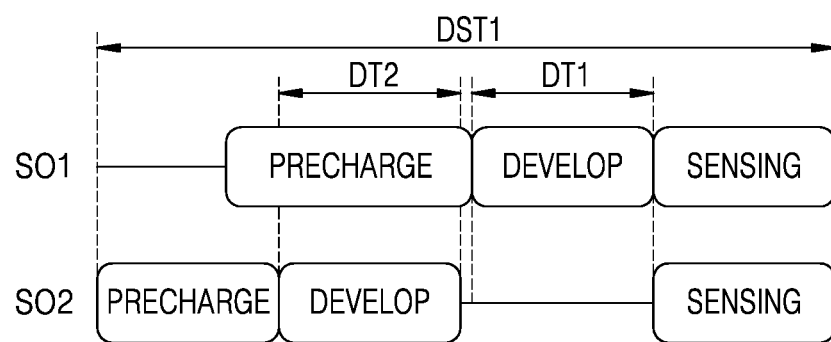
FIGS. 8A through 8D illustrate data detection operations according to embodiments.

Referring to FIG. 8A, a precharge operation of the second sensing node SO2 may be started earlier than a precharge operation of the first sensing node SO1. A develop operation of the second sensing node SO2 may be started earlier than a develop operation of the first sensing node SO1. The develop operation of the second sensing node SO2 may be started during the precharge operation of the first sensing node SO1. The develop operation of the first sensing node SO1 may be started after the develop operation of the second sensing node SO2 is terminated. In this case, a develop time (hereinafter, referred to as a first develop time DT1) of the first sensing node SO1 may not overlap with a develop time (hereinafter, referred to as a second develop time DT2) of the second sensing node SO2. After the end of the develop operation of the first sensing node SO1, a sensing operation of the first sensing node SO1 and a sensing operation of the second sensing node SO2 may be started. For example, the sensing operations of the first and second sensing nodes SO1 and SO2 may be started at the same timing, but embodiments are not limited thereto.

Figure 8B:
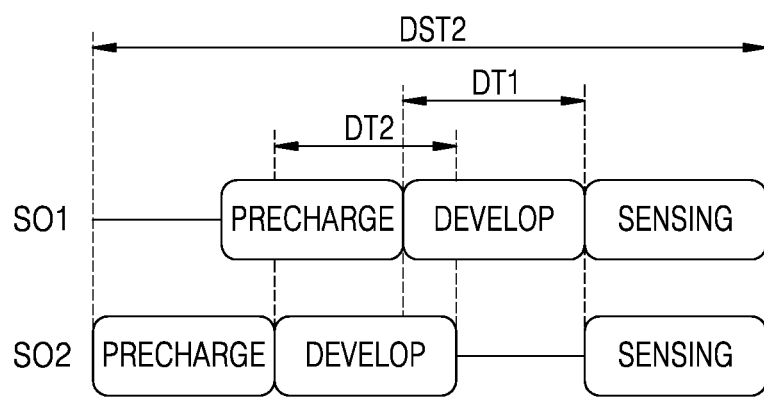

Referring to FIG. 8B, the precharge operation of the second sensing node SO2 may be started earlier than the precharge operation of the first sensing node SO1. The develop operation of the second sensing node SO2 may be started earlier than the develop operation of the first sensing node SO1. The develop operation of the second sensing node SO2 may be started during the precharge operation of the first sensing node SO1. The develop operation of the first sensing node SO1 may be started before the develop operation of the second sensing node SO2 is terminated. In this case, the first develop time DT1 and the second develop time DT2 may partially overlap with each other. After the end of the develop operation of the first sensing node SO1, the sensing operation of the first sensing node SO1 and the sensing operation of the second sensing node SO2 may be started.

In an example embodiment, when the first develop time DT1 and the second develop time DT2 partially overlap with each other as shown in FIG. 8B, a time of a data detection operation (e.g., a read operation or a program verify operation) may be reduced. Accordingly, a data detection time DST2 in the embodiment of FIG. 8B may be less than a data detection time DST1 in the embodiment of FIG. 8A.

Figure 8C:
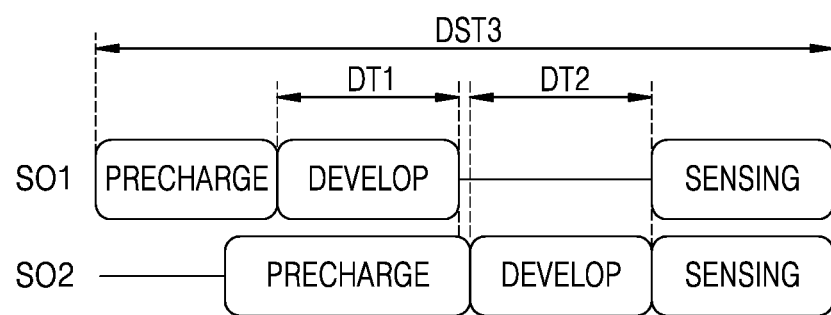

Referring to FIG. 8C, the precharge operation of the first sensing node SO1 may be started earlier than the precharge operation of the second sensing node SO2. The develop operation of the first sensing node SO1 may be started earlier than the develop operation of the second sensing node SO2. The develop operation of the first sensing node SO1 may be started during the precharge operation of the second sensing node SO2. The develop operation of the second sensing node SO2 may be started after the develop operation of the first sensing node SO1 is terminated. In this case, the first develop time DT1 and the second develop time DT2 may not overlap with each other. After the end of the develop operation of the second sensing node SO2, the sensing operation of the first sensing node SO1 and the sensing operation of the second sensing node SO2 may be started.

Figure 8D:
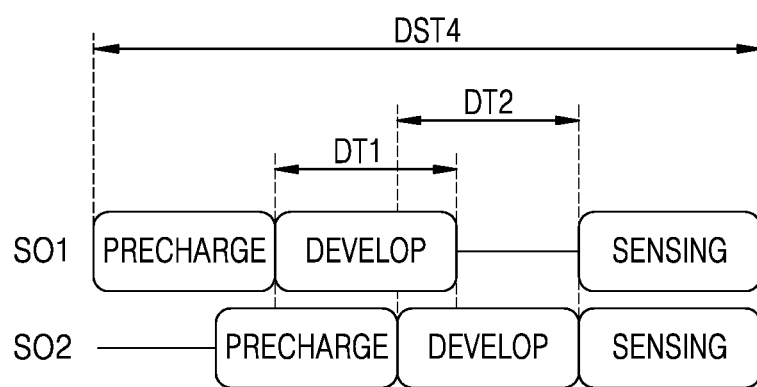

Referring to FIG. 8D, the precharge operation of the first sensing node SO1 may be started earlier than the precharge operation of the second sensing node SO2. The develop operation of the first sensing node SO1 may be started earlier than the develop operation of the second sensing node SO2. The develop operation of the first sensing node SO1 may be started during the precharge operation of the second sensing node SO2. The develop operation of the second sensing node SO2 may be started before the develop operation of the first sensing node SO1 is terminated. In this case, the first develop time DT1 and the second develop time DT2 may partially overlap with each other. After the end of the develop operation of the second sensing node SO2, the sensing operation of the first sensing node SO1 and the sensing operation of the second sensing node SO2 may be started.

In an example embodiment, when the first develop time DT1 and the second develop time DT2 partially overlap with each other as shown in FIG. 8D, a time of a data detection operation may be reduced. Accordingly, a data detection time DST4 in the embodiment of FIG. 8D may be less than a data detection time DST3 in the embodiment of FIG. 8C.

As described above, in the data detection operations according to embodiments, adjacent page buffers may be controlled such that precharge and develop timings of sensing nodes are different from one another. When a develop start time of the first sensing node SO1 is different from a develop start time of the second sensing node SO2 as shown in FIGS. 8A through 8D, the influence of coupling by the develop operation of the first page buffer PB1 may be reduced. For example, when the first develop time DT1 does not overlap with the second develop time DT2, the develop operation of the second page buffer PB2 may be performed, without the voltage change of second sensing node SO2 by coupling. Accordingly, in the develop operation of the second page buffer PB2, the degradation of data reliability by coupling may not occur.

In an example embodiment, when the first develop time DT1 partially overlaps with the second develop time DT2, the voltage of the second sensing node SO2 may be changed by coupling during the develop operation of the second page buffer PB2. When the second page buffer PB2 is controlled to decrease the second develop time DT2, the influence of coupling on the develop operation of the second page buffer PB2 may be reduced. For example, in the embodiments of FIGS. 8B and 8D, the second page buffer PB2 may be controlled such that the second develop time DT2 is less than the first develop time DT1. For example, the second page buffer PB2 may be controlled such that the second develop time DT2 in the embodiments of FIGS. 8B and 8D is less than the second develop time DT2 in the embodiments of FIGS. 8A and 8C.

Figure 9:
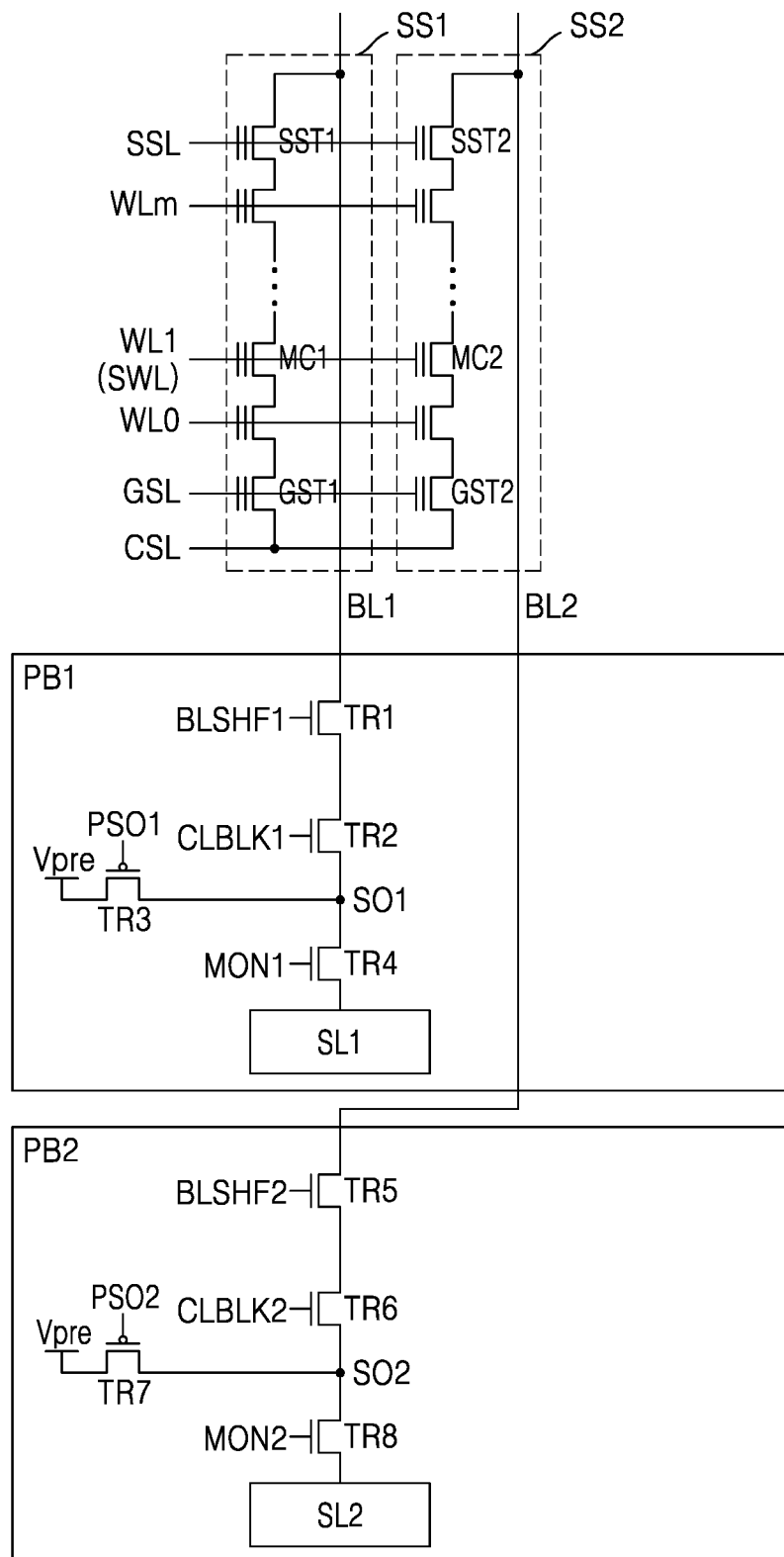
FIG. 9 is a circuit diagram showing page buffers according to an embodiment.

FIG. 9 is a circuit diagram showing page buffers according to an embodiment. Referring to FIG. 9, the first page buffer PB1 may be connected to a first NAND string SS1 through the first bit line BL1, and the second page buffer PB2 may be connected to a second NAND string SS2 through the second bit line BL2. Although it is illustrated in FIG. 9 for convenience of description that the first page buffer PB1 and the second page buffer PB2 are directly connected to the first bit line BL1 and the second bit line BL2, respectively, the first page buffer PB1 and the second page buffer PB2, which will be described below, may also be applied to the first page buffer 421 and the second page buffer 422, which are respectively connected to bit lines via through electrodes.

The first NAND string SS1 may include a ground selection transistor GST1, memory cells including the first memory cell MC1, and a string selection transistor SST1. The second NAND string SS2 may include a ground selection transistor GST2, memory cells including the second memory cell MC2, and a string selection transistor SST2. The ground selection transistors GST1 and GST2 may be connected to a common source line CSL and a ground selection line GSL, and the memory cells may be connected to zeroth to m-th word lines WL0 through WLm. For example, the first memory cell MC1 of the first NAND string SS1 and the second memory cell MC2 of the second NAND string SS2 may be connected to the first word line WL1 corresponding to the selected word line SWL. The string selection transistors SST1 and SST2 may be connected in common to a string selection line SSL and respectively connected to the first and second bit lines BL1 and BL2. Accordingly, the first memory cell MC1 may be connected to the first page buffer PB1 through the first bit line BL1, and the second memory cell MC2 may be connected to the second page buffer PB2 through the second bit line BL2. It will be understood that when an element is referred to as being "connected" or "on" another element, it can be directly connected or on the other element or intervening elements may be present. In contrast, when an element is referred to as being "directly connected" to or "directly on" another element, or as "contacting" or "in contact with" another element, there are no intervening elements present at the point of contact.

The first page buffer PB1 may include a first transistor TR1, which is driven by a first bit line shut-off signal BLSHF1, and a second transistor TR2, which is driven by a first bit line connection control signal CLBLK1. For example, the first transistor TR1 may be turned on according to the first bit line shut-off signal BLSHF1 at a high level and turned off according to the first bit line shut-off signal BLSHF1 at a low level. For example, the second transistor TR2 may be turned on according to the first bit line connection control signal CLBLK1 at a high level and turned off according to the first bit line connection control signal CLBLK1 at a low level.

The first transistor TR1 and the second transistor TR2 may be between the first bit line BL1 and the first sensing node SO1. Although it is illustrated in FIG. 9 that the first transistor TR1 is directly connected to the first bit line BL1, embodiments are not limited thereto. For example, a separate transistor (e.g., a bit line selection transistor) for selecting a bit line may be further provided between the first bit line BL1 and the first transistor TR1.

The first page buffer PB1 may further include a third transistor TR3 driven by a first precharge control signal PSO1. For example, the third transistor TR3 may be turned on according to the first precharge control signal PSO1 at a low level and turned off according to the first precharge control signal PSO1 at a high level. When the third transistor TR3 is turned on, the precharge operation of the first page buffer PB1 may be started based on a precharge voltage Vpre. For example, the voltage of the first sensing node SO1 may be increased, and the first sensing node SO1 may be precharged to a voltage level corresponding to the precharge voltage Vpre. When the third transistor TR3 is turned off, the precharge operation of the first page buffer PB1 may be terminated.

When the first and second transistors TR1 and TR2 are in a turned-on state and the third transistor TR3 is turned off after the precharge operation is performed, the develop operation of the first page buffer PB1 may be started. For example, the develop operation of the first page buffer PB1 may be started by electrically connecting the precharged first sensing node SO1 to the first bit line BL1. During the develop operation, the voltage of the first sensing node SO1 may be changed according to data stored in the first memory cell MC1. For example, when the first memory cell MC1 is an on-cell, the voltage of the first sensing node SO1 may be decreased to or below a reference voltage. When the first memory cell MC1 is an off-cell, the voltage of the first sensing node SO1 may be maintained at the reference voltage or higher. The reference voltage may be used to determine whether the first memory cell MC1 is an on-cell or an off-cell. In other words, the reference voltage may be used to identify whether a data value stored in the first memory cell MC1 is 0 or 1. When the second transistor TR2 is turned off, the develop operation of the first page buffer PB1 may be terminated.

The first page buffer PB1 may further include a fourth transistor TR4, which is driven by a first sensing monitoring signal MON1, and a first sensing latch SL1. The fourth transistor TR4 may be between the first sensing node SO1 and the first sensing latch SL1. For example, the fourth transistor TR4 may be turned on according to the first sensing monitoring signal MON1 at a high level and turned off according to the first sensing monitoring signal MON1 at a low level. When the fourth transistor TR4 is turned on after the develop operation, data sensed from the first memory cell MC1 may be stored in the first sensing latch SL1. The sensing operation of the first page buffer PB1 may be performed by storing the data of the first memory cell MC1 in the first sensing latch SL1. For example, although not shown in FIG. 9, the first page buffer PB1 may further include data latches and a cache latch as well as the first sensing latch SL1.

The second page buffer PB2 may include a fifth transistor TR5, which is driven by a second bit line shut-off signal BLSHF2, and a sixth transistor TR6, which is driven by a second bit line connection control signal CLBLK2. The second page buffer PB2 may further include a seventh transistor TR7 driven by a second precharge control signal PSO2, an eighth transistor TR8 driven by a second sensing monitoring signal MON2, and a second sensing latch SL2. As shown in FIG. 9, the configuration of the second page buffer PB2 may be the same as that of the first page buffer PB1, and accordingly, the operations of the second page buffer PB2 may be substantially the same as those of the first page buffer PB1. Therefore, redundant descriptions thereof are omitted.

As described above, each page buffer may detect data, which is stored in a memory cell, by performing a precharge operation, a develop operation, and a sensing operation based on transistors. The transistors of each page buffer may be driven based on control signals. The page buffer controllers 230, 330, and 430 described above may control page buffers using control signals.

Hereinafter, control signals generated to control the first page buffer PB1 and the second page buffer PB2 will be described in detail with reference to FIGS. 10A through 14B. In detail, an example of performing a data detection operation using the first and second page buffers PB1 and PB2 based on the same control timings will be described with reference to FIGS. 10A and 10B; and examples of performing a data detection operation using the first and second page buffers PB1 and PB2 based on different control timings will be described with reference to FIGS. 11A through 14B. For convenience of description, it is assumed that the first memory cell MC1 is an on-cell and the second memory cell MC2 is an off-cell, but embodiments are not limited thereto. For example, when the first memory cell MC1 is an off-cell and the second memory cell MC2 is an on-cell or both the first and second memory cells MC1 and MC2 are on-cells, a data detection operation may be performed using the first and second page buffers PB1 and PB2 based on different control timings.

Figure 10A:
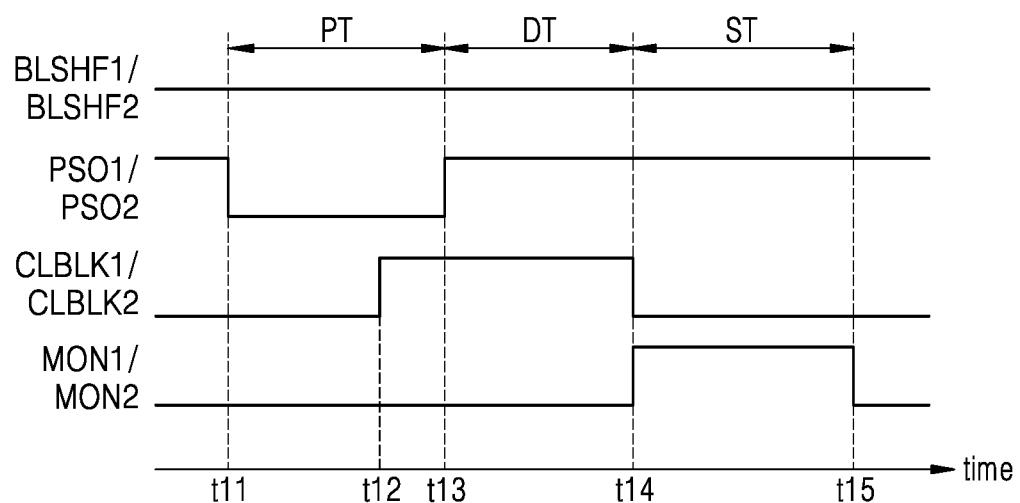
FIG. 10A is a timing diagram of control signals for performing a data detection operation based on the same control timings.
Figure 10B:
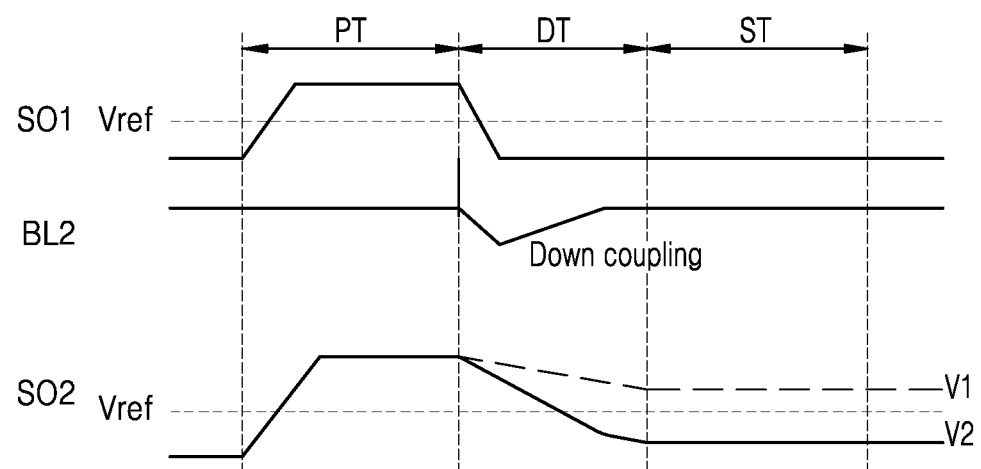
FIG. 10B is a timing diagram showing the voltage changes of sensing nodes with respect to the control signals of FIG. 10A.

FIG. 10A is a timing diagram of control signals for performing a data detection operation based on the same control timings. FIG. 10B is a timing diagram showing the voltage changes of sensing nodes with respect to the control signals of FIG. 10A.

Referring to FIGS. 9, 10A, and 10B, the first and second bit line shut-off signals BLSHF1 and BLSHF2 may be controlled to be at the high level. The first and second precharge control signals PSO1 and PSO2 may be controlled to be at the low level from a first time point t11 to a third time point t13. Accordingly, the precharge operation of each of the first and second page buffers PB1 and PB2 may be performed from the first time point t11 to the third time point t13. During a precharge time PT, the voltage of each of the first and second sensing nodes SO1 and SO2 may be increased to a voltage level corresponding to the precharge voltage Vpre.

The first and second bit line connection control signals CLBLK1 and CLBLK2 may be controlled to be at the high level from a second time point t12 to a fourth time point t14. The first and second precharge control signals PSO1 and PSO2 may be controlled to be at the high level from the third time point t13 to the fourth time point t14. While the first and second precharge control signals PSO1 and PSO2 and the first and second bit line connection control signals CLBLK1 and CLBLK2 are being controlled to be at the high level (i.e., during a period from the third time point t13 to the fourth time point t14), the develop operation of each of the first and second page buffers PB1 and PB2 may be performed. For example, the develop operation of each of the first and second page buffers PB1 and PB2 by electrically connecting the first and second sensing nodes SO1 and SO2 to the first and second bit lines BL1 and BL2, respectively.

During a develop time DT, the voltage of the first sensing node SO1 may be developed according to data stored in the first memory cell MC1, and the voltage of the second sensing node SO2 may be developed according to data stored in the second memory cell MC2. For example, the voltage of the first sensing node SO1 may decrease below a reference voltage Vref. In this case, the second bit line BL2 adjacent to the first sensing node SO1 may undergo down-coupling according to the voltage change of the first sensing node SO1. When the voltage of the second bit line BL2 is changed by down-coupling, the voltage of the second sensing node SO2 may be decreased more than when there is no down-coupling influence. For example, when there is no down-coupling influence, the voltage of the second sensing node SO2 may be developed to a first voltage V1 that is higher than the reference voltage Vref. When there is a down-coupling influence, the voltage of the second sensing node SO2 may be developed to a second voltage V2 that is lower than the reference voltage Vref. In other words, when the develop time DT of the first page buffer PB1 is the same as the develop time DT of the second page buffer PB2, the voltage of the second sensing node SO2 may be further decreased due to down-coupling during the develop time DT.

The first and second sensing monitoring signals MON1 and MON2 may be controlled to be at the high level from the fourth time point t14 to a fifth time point t15. Accordingly, data sensed by the first sensing node SO1 and data sensed by the second sensing node SO2 may be respectively stored in the first and second sensing latches SL1 and SL2. A data value stored in each of the first and second sensing latches SL1 and SL2 may correspond to a voltage developed during the develop time DT. Because the voltage of the second sensing node SO2 may be developed to the second voltage V2 that is lower than the reference voltage Vref during the develop time DT due to the down-coupling influence, a data value stored in the second sensing latch SL2 during a sensing time ST may be changed. In other words, data having a value different from a data value stored in the second memory cell MC2 may be stored in the second sensing latch SL2.

As described above, when the first and second page buffers PB1 and PB2 are controlled based on the same control timings, a data value detected by the second page buffer PB2 may be changed because of the down-coupling influence. Accordingly, the reliability of data detected through page buffers may be degraded.

Figure 11A:
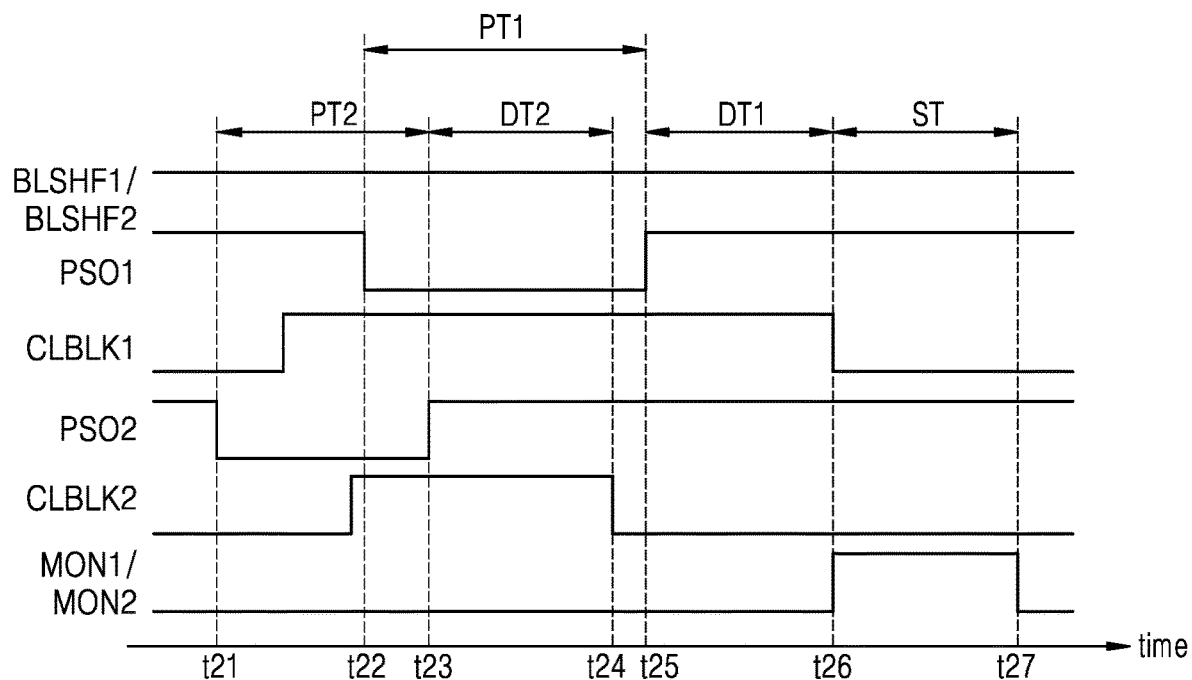
FIG. 11A is a timing diagram of examples of control signals for performing a data detection operation based on different control timings.
Figure 11B:
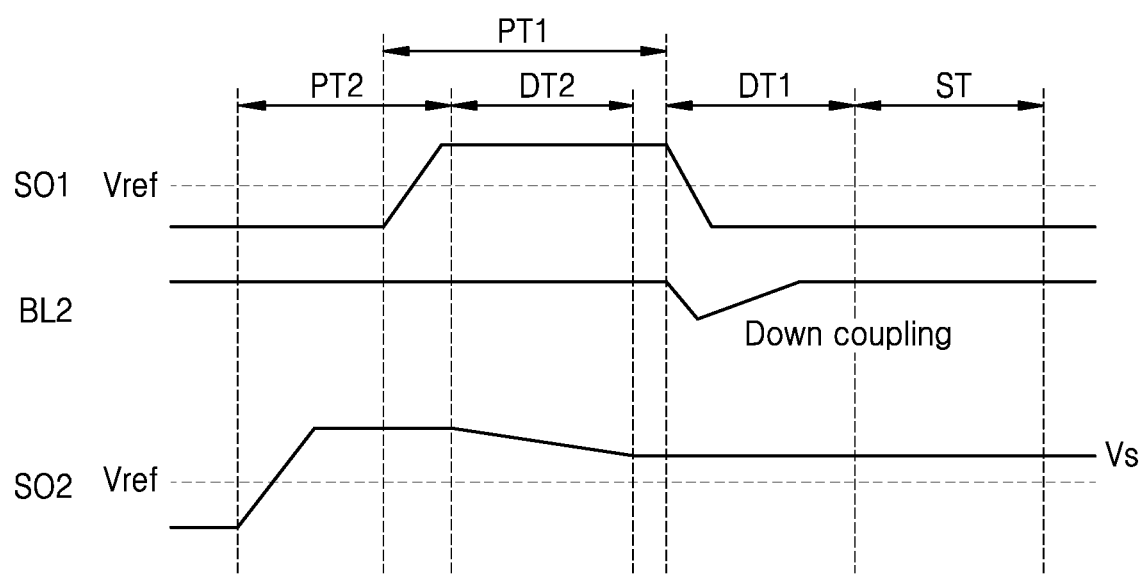
FIG. 11B is a timing diagram showing the voltage changes of sensing nodes with respect to the control signals of FIG. 11A.

FIG. 11A is a timing diagram of control signals for performing a data detection operation based on different control timings. FIG. 11B is a timing diagram showing the voltage changes of sensing nodes with respect to the control signals of FIG. 11A. In detail, the embodiment of FIGS. 11A and 11B may correspond to the embodiment of FIG. 8A.

Referring to FIGS. 9, 11A, and 11B, the first and second bit line shut-off signals BLSHF1 and BLSHF2 may be controlled to be at the high level. The second precharge control signal PSO2 may be controlled to be at the low level from a first time point t21 to a third time point t23. Accordingly, the precharge operation of the second page buffer PB2 may be performed from the first time point t21 to the third time point t23. During a precharge time (hereinafter, referred to as a second precharge time PT2) of the second page buffer PB2, the voltage of the second sensing node SO2 may be increased to a voltage level corresponding to the precharge voltage Vpre.

The first precharge control signal PSO1 may be controlled to be at the low level from a second time point t22 to a fifth time point t25. Accordingly, the precharge operation of the first page buffer PB1 may be performed from the second time point t22 to the fifth time point t25. During a precharge time (hereinafter, referred to as a first precharge time PT1) of the first page buffer PB1, the voltage of the first sensing node SO1 may be increased to a voltage level corresponding to the precharge voltage Vpre.

While the second precharge control signal PSO2 and the second bit line connection control signal CLBLK2 are being controlled to be at the high level (i.e., during a time period from the third time point t23 to a fourth time point t24), the develop operation of the second page buffer PB2 may be performed (i.e., second develop time DT2). During the second develop time DT2 of the second page buffer PB2, the voltage of the second sensing node SO2 may be developed according to data stored in the second memory cell MC2. When the second memory cell MC2 is an off-cell, the voltage of the second sensing node SO2 may be developed to a voltage Vs higher than the reference voltage Vref.

While the first precharge control signal PSO1 and the first bit line connection control signal CLBLK1 are being controlled to be at the high level (i.e., during a time period from the fifth time point t25 to a sixth time point t26), the develop operation of the first page buffer PB1 may be performed (i.e., first develop time DT1). During the first develop time DT1 of the first page buffer PB1, the voltage of the first sensing node SO1 may be developed according to data stored in the first memory cell MC1. When the first memory cell MC1 is an on-cell, the voltage of the first sensing node SO1 may decrease below the reference voltage Vref. In this case, the second bit line BL2 may be down-coupled according to the voltage change of the first sensing node SO1. Because the second bit line connection control signal CLBLK2 is controlled to be at the low level during the first develop time DT1, the voltage of the second sensing node SO2 may be maintained regardless of the voltage change of the second bit line BL2.

The first and second sensing monitoring signals MON1 and MON2 may be controlled to be at the high level from the sixth time point t26 to a seventh time point t27. Accordingly, data sensed by the first sensing node SO1 and data sensed by the second sensing node SO2 may be respectively stored in the first and second sensing latches SL1 and SL2. Because the voltage of the second sensing node SO2 is not changed even if down-coupling of the second bit line BL2 occurs during the first develop time DT1, a data value stored in the second sensing latch SL2 during a sensing time ST may not be changed. Accordingly, the reliability of data detected by the second page buffer PB2 may be maintained.

Figure 12A:
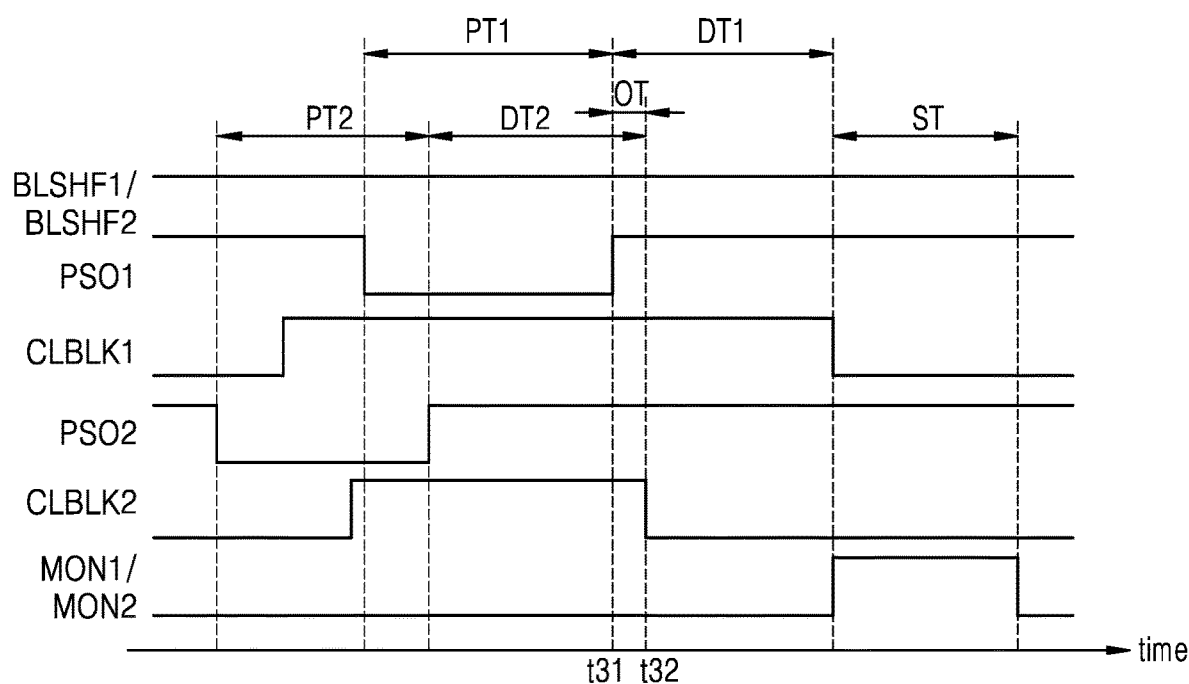
FIG. 12A is a timing diagram of examples of control signals for performing a data detection operation based on different control timings.
Figure 12B:
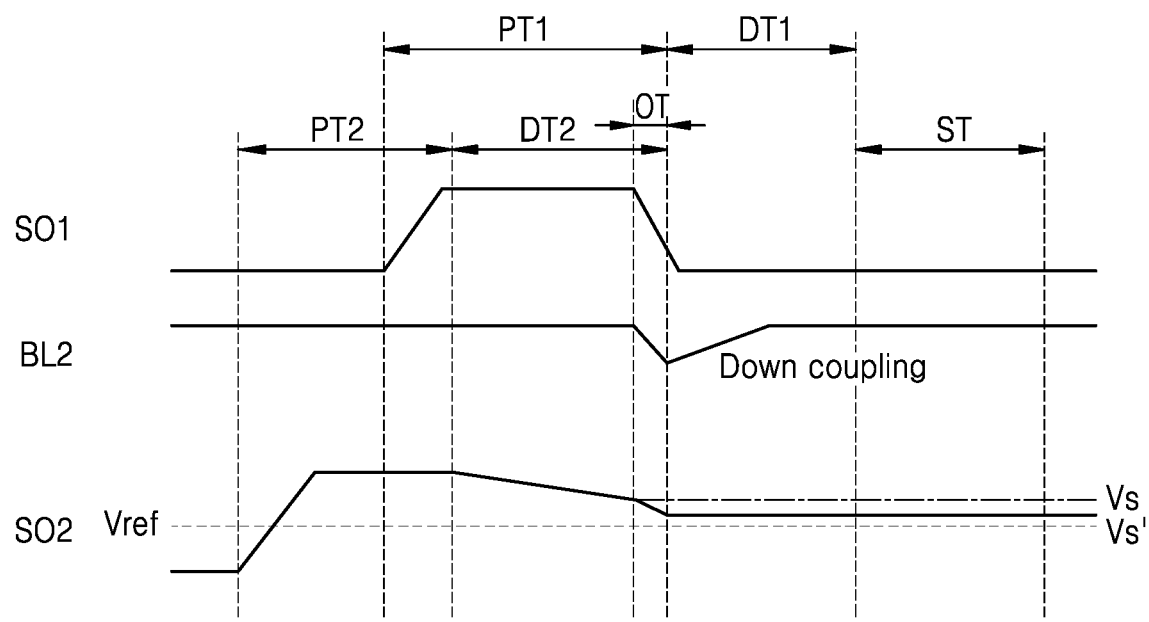
FIG. 12B is a timing diagram showing the voltage changes of sensing nodes with respect to the control signals of FIG. 12A.

FIG. 12A is a timing diagram of control signals for performing a data detection operation based on different control timings. FIG. 12B is a timing diagram showing the voltage changes of sensing nodes with respect to the control signals of FIG. 12A. In detail, the embodiment of FIGS. 12A and 12B may correspond to the embodiment of FIG. 8B. The control signals of FIG. 12A may be generated in a similar manner to the control signals of FIG. 11A, and thus, redundant descriptions thereof will be omitted.

Referring to FIGS. 9, 12A, and 12B, the develop operation of the first page buffer PB1 may be started before the develop operation of the second page buffer PB2 is terminated. For example, before the second bit line connection control signal CLBLK2 transits from the high level to the low level at a second time point t32, the first precharge control signal PSO1 may transit from the low level to the high level. Accordingly, the first develop time DT1 may partially overlap with the second develop time DT2. In other words, an overlap time OT may occur.

During the overlap time OT, the voltage of the second bit line BL2 may be decreased due to down-coupling. Because the second bit line connection control signal CLBLK2 is maintained at the high level during the overlap time OT, the voltage of the second sensing node SO2 may be changed according to the voltage change of the second bit line BL2. For example, during the second develop time DT2, the voltage of the second sensing node SO2 may be developed to a voltage Vs' due to down-coupling. The voltage Vs' involved in down-coupling may be lower than the voltage Vs in the example of FIGS. 11A and 11B (for example, when there is no down-coupling influence).

Even when the voltage of the second sensing node SO2 is decreased due to down-coupling in the develop operation of the second page buffer PB2, the voltage Vs' of the second sensing node SO2 may be higher than the reference voltage Vref due to the short duration of the overlap time OT. Accordingly, the reliability of data detected by the second page buffer PB2 may be maintained.

In an example embodiment, the second page buffer PB2 may be controlled to decrease the second develop time DT2 such that the down-coupling influence during the overlap time OT is reduced. In other words, the second page buffer PB2 may be controlled such that the overlap time OT is reduced. Accordingly, even when the voltage of the second sensing node SO2 is decreased due to down-coupling during the overlap time OT, the voltage Vs' of the second sensing node SO2 may be maintained to be higher than the reference voltage Vref.

Figure 13A:
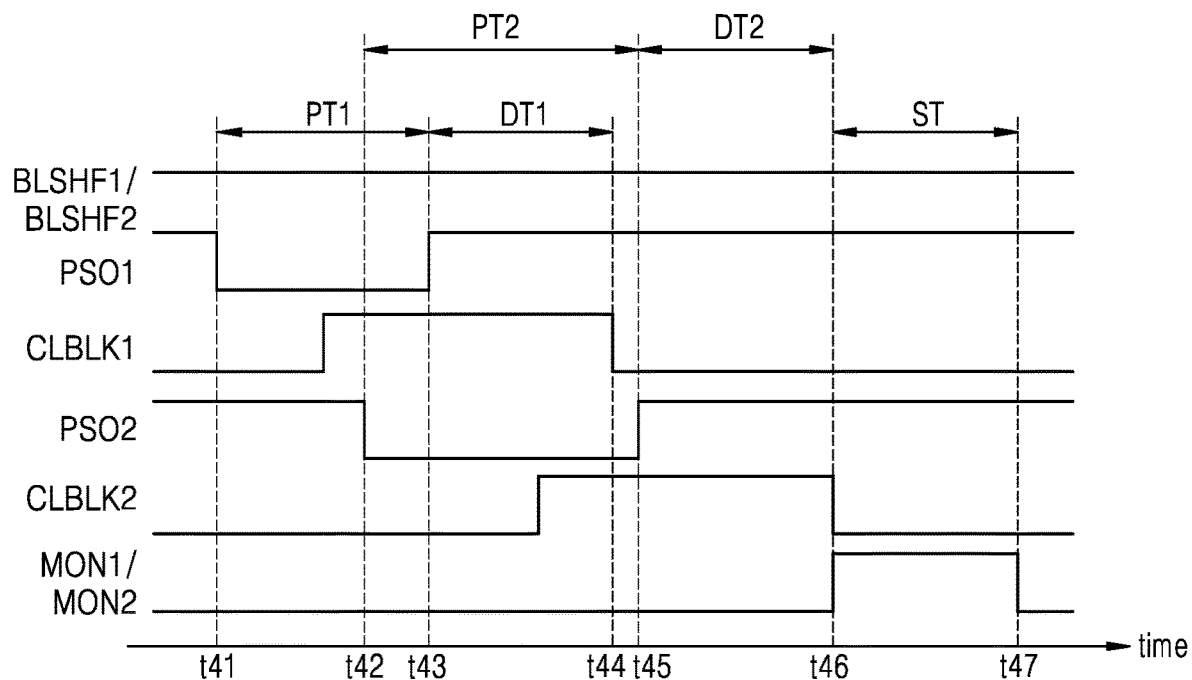
FIG. 13A is a timing diagram of examples of control signals for performing a data detection operation based on different control timings.
Figure 13B:
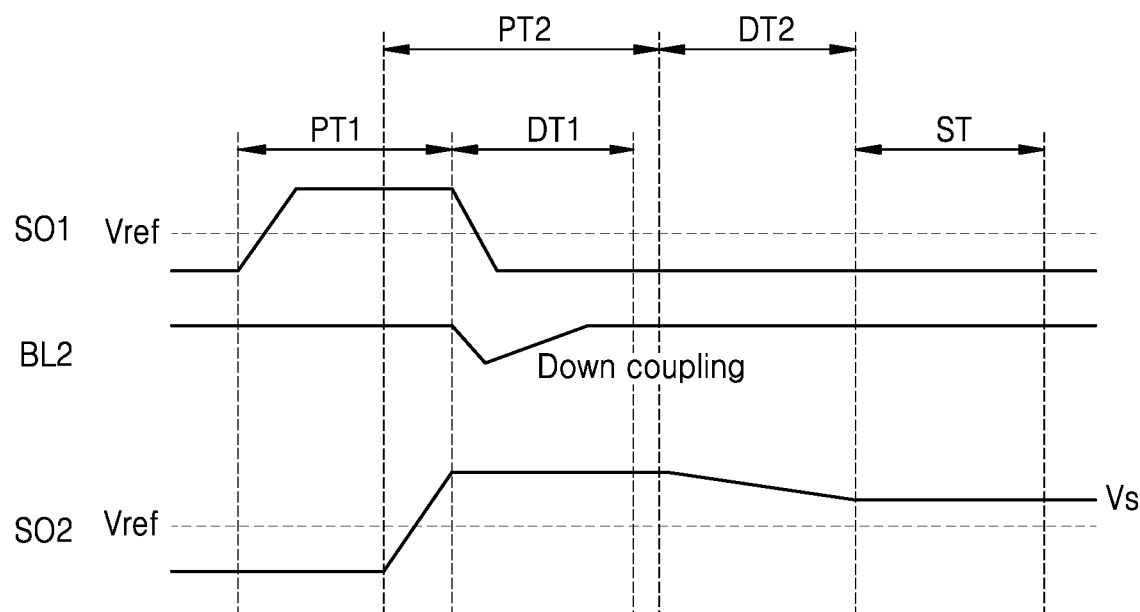
FIG. 13B is a timing diagram showing the voltage changes of sensing nodes with respect to the control signals of FIG. 13A.

FIG. 13A is a timing diagram of control signals for performing a data detection operation based on different control timings. FIG. 13B is a timing diagram showing the voltage changes of sensing nodes with respect to the control signals of FIG. 13A. In detail, the embodiment of FIGS. 13A and 13B may correspond to the embodiment of FIG. 8C.

Referring to FIGS. 9, 13A, and 13B, the first and second bit line shut-off signals BLSHF1 and BLSHF2 may be controlled to be at the high level. The first precharge control signal PSO1 may be controlled to be at the low level from a first time point t41 to a third time point t43. Accordingly, the precharge operation of the first page buffer PB1 may be performed from the first time point t41 to the third time point t43. During the first precharge time PT1 of the first page buffer PB1, the voltage of the first sensing node SO1 may be increased to a voltage level corresponding to the precharge voltage Vpre.

The second precharge control signal PSO2 may be controlled to be at the low level from a second time point t42 to a fifth time point t45. Accordingly, the precharge operation of the second page buffer PB2 may be performed from the second time point t42 to the fifth time point t45. During the second precharge time PT2 of the second page buffer PB2, the voltage of the second sensing node SO2 may be increased to a voltage level corresponding to the precharge voltage Vpre.

While the first precharge control signal PSO1 and the first bit line connection control signal CLBLK1 are being controlled to be at the high level (i.e., during a time period from the third time point t43 to a fourth time point t44), the develop operation of the first page buffer PB1 may be performed. During the first develop time DT1 of the first page buffer PB1, the voltage of the first sensing node SO1 may be developed according to data stored in the first memory cell MC1. When the first memory cell MC1 is an on-cell, the voltage of the first sensing node SO1 may be decreased below the reference voltage Vref. In this case, the second bit line BL2 may be down-coupled according to the voltage change of the first sensing node SO1. Even when the second bit line BL2 is down-coupled, the precharge operation of the second sensing node SO2 may be normally performed. For example, when the second precharge time PT2 is maintained until the down-coupling influence disappears or when the second bit line connection control signal CLBLK2 is controlled to be at the high level after the down-coupling influence disappears, the precharge operation of the second sensing node SO2 may be normally performed. Accordingly, the second sensing node SO2 may have a voltage corresponding to the precharge voltage Vpre during the second precharge time PT2.

While the second precharge control signal PSO2 and the second bit line connection control signal CLBLK2 are being controlled to be at the high level (i.e., during a time period from the fifth time point t45 to a sixth time point t46), the develop operation of the second page buffer PB2 may be performed. During the second develop time DT2 of the second page buffer PB2, the voltage of the second sensing node SO2 may be developed according to data stored in the second memory cell MC2. When the second memory cell MC2 is an off-cell, the voltage of the second sensing node SO2 may be developed to the voltage Vs higher than the reference voltage Vref. Because the second sensing node SO2 has a voltage corresponding to the precharge voltage Vpre during the second precharge time PT2, the voltage of the second sensing node SO2 may be developed regardless of down-coupling occurring during the first develop time DT1.

The first and second sensing monitoring signals MON1 and MON2 may be controlled to be at the high level from the sixth time point t46 to a seventh time point t47. Accordingly, data sensed by the first sensing node SO1 and data sensed by the second sensing node SO2 may be respectively stored in the first and second sensing latches SL1 and SL2. As described above, because the developed voltage of the second sensing node SO2 is not changed even if down-coupling occurs during the first develop time DT1, a data value stored in the second sensing latch SL2 during a sensing time ST may not be changed. Accordingly, the reliability of data detected by the second page buffer PB2 may be maintained.

Figure 14A:
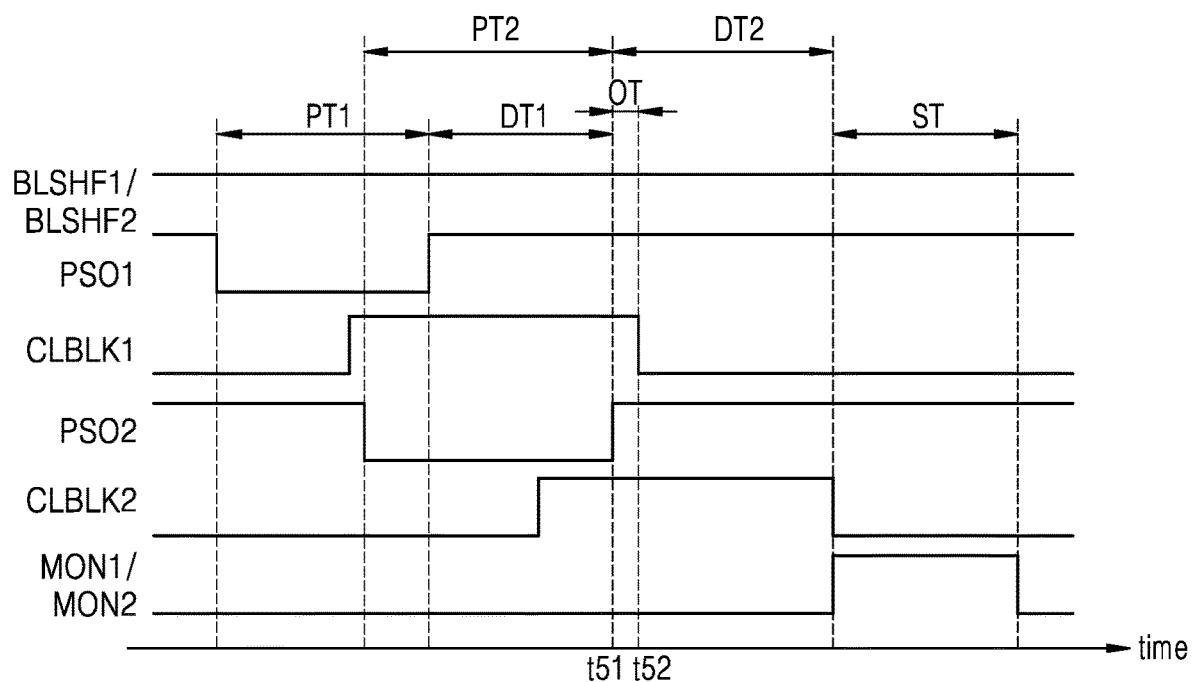
FIG. 14A is a timing diagram of examples of control signals for performing a data detection operation based on different control timings.
Figure 14B:
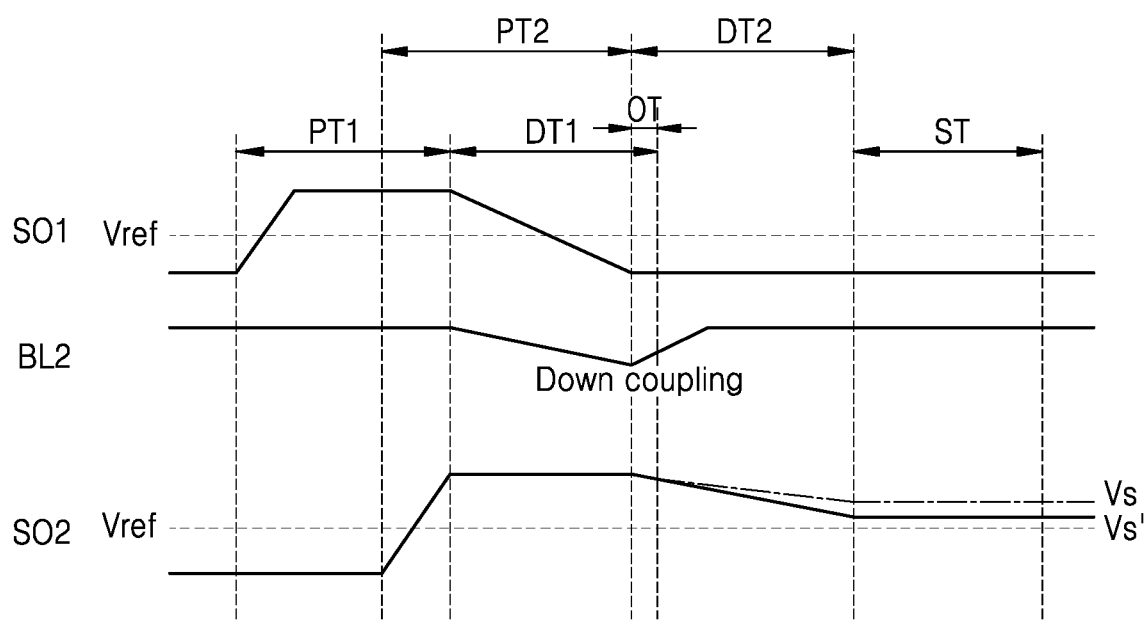
FIG. 14B is a timing diagram showing the voltage changes of sensing nodes with respect to the control signals of FIG. 14A.

FIG. 14A is a timing diagram of control signals for performing a data detection operation based on different control timings. FIG. 14B is a timing diagram showing the voltage changes of sensing nodes with respect to the control signals of FIG. 14A. In detail, the embodiment of FIGS. 14A and 14B may correspond to the embodiment of FIG. 8D. The control signals of FIG. 14A may be generated in a similar manner to the control signals of FIG. 13A, and thus, redundant descriptions thereof will be omitted.

Referring to FIGS. 9, 14A, and 14B, the develop operation of the second page buffer PB2 may be started before the develop operation of the first page buffer PB1 is terminated. For example, before the first bit line connection control signal CLBLK1 transits from the high level to the low level at a second time point t52, the second precharge control signal PSO2 may transit from the low level to the high level. Accordingly, the first develop time DT1 may partially overlap with the second develop time DT2. In other words, the overlap time OT may occur.

During the overlap time OT, the voltage of the second bit line BL2 may be decreased due to down-coupling. Because the second bit line connection control signal CLBLK2 is maintained at the high level during the overlap time OT, the voltage of the second sensing node SO2 may be changed according to the voltage change of the second bit line BL2. For example, during the second develop time DT2, the voltage of the second sensing node SO2 may be developed to the voltage Vs' due to down-coupling. The voltage Vs' involved in down-coupling may be lower than the voltage Vs in the example of FIGS. 13A and 13B (for example, when there is no down-coupling influence).

Even when the voltage of the second sensing node SO2 is decreased due to down-coupling in the develop operation of the second page buffer PB2, the voltage Vs' of the second sensing node SO2 may be higher than the reference voltage Vref due to the duration of the second develop time DT2. Accordingly, the reliability of data detected by the second page buffer PB2 may be maintained.

In an example embodiment, the second page buffer PB2 may be controlled to decrease the second develop time DT2 such that the down-coupling influence during the overlap time OT is reduced. Accordingly, even when the voltage of the second sensing node SO2 is decreased due to down-coupling, the voltage of the second sensing node SO2 may be developed to the voltage Vs' higher than the reference voltage Vref during the second develop time DT2.

As described above, when the first page buffer PB1 and the second page buffer PB2 are controlled such that the first develop time DT1 partially overlaps with the second develop time DT2, a total time of a data detection operation may be reduced even if a sensing margin is reduced with the decrease in the voltage of the second sensing node SO2.

As described above with reference to FIGS. 11A through 14B, the first page buffer PB1 and the second page buffer PB2 may be controlled based on different control timings. For example, a precharge time of the first page buffer PB1 may be different from a precharge time of the second page buffer PB2, and a develop time of the first page buffer PB1 may be different from a develop time of the second page buffer PB2. In this case, the reliability of data detected by a page buffer may be maintained regardless of the precharge or develop operation of an adjacent page buffer.

Figure 15:
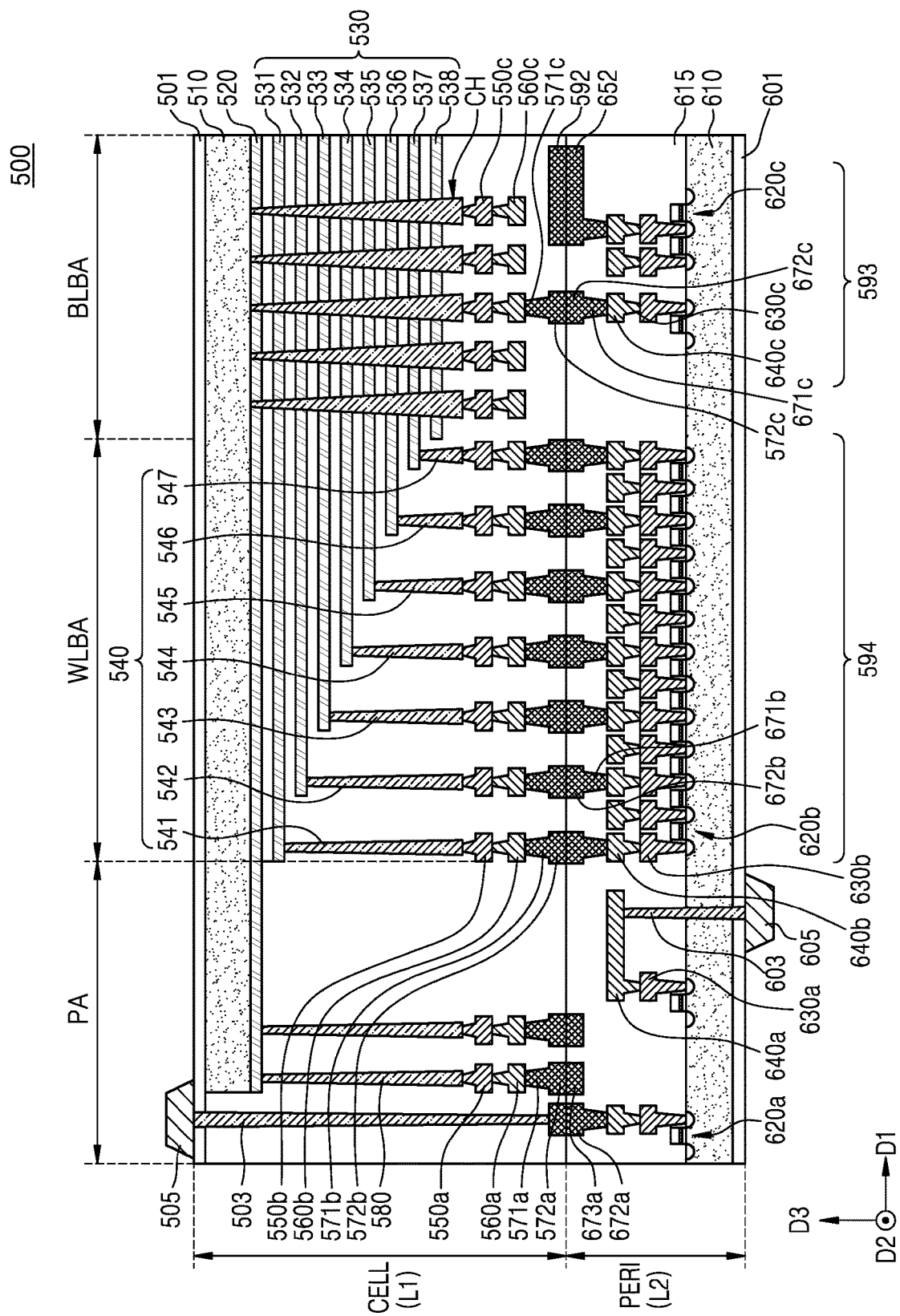
FIG. 15 is an example cross-sectional view of the memory device of FIG. 5.

FIG. 15 is an example cross-sectional view of the memory device of FIG. 5. In detail, FIG. 15 shows a cross-sectional view of a memory device 500 having the C2C structure. Referring to FIG. 15, a cell region CELL of the memory device 500 may correspond to the first semiconductor layer L1, and a peripheral circuit region PERI of the memory device 500 may correspond to the second semiconductor layer L2. Each of the cell region CELL and the peripheral circuit region PERI of the memory device 500 may include an external pad bonding area PA, a word line bonding area WLBA, and a bit line bonding area BLBA.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In an example embodiment, the first metal layers 630a, 630b, and 630c may be formed of tungsten having relatively high resistivity, and the second metal layers 640a, 640b, and 640c may be formed of copper having relatively low resistivity.

In an example embodiment, although only the first metal layers 630a, 630b, and 630c and the second metal layers 640a, 640b, and 640c are shown and described, the example embodiment is not limited thereto, and one or more additional metal layers may be further formed on the second metal layers 640a, 640b, and 640c. At least a portion of the one or more additional metal layers formed on the second metal layers 640a, 640b, and 640c may be formed of aluminum or the like having a lower resistivity than those of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, or the like. Further, the upper bonding metals 571b and 572b in the cell region CELL may be referred to as first metal pads and the lower bonding metals 5271b and 5272b in the peripheral circuit region PERI may be referred to as second metal pads.

The cell region CELL may include at least one memory block. The cell region CELL may include a second substrate 510 and a common source line 520. On the second substrate 510, a plurality of word lines 531 to 538 (i.e., 530) may be stacked in a direction (a third direction D3), perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in a direction (a third direction D3), perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an example embodiment, the bit line 560c may extend in a second direction D2, parallel to the upper surface of the second substrate 510.

In an example embodiment, an area in which the channel structure CH, the bit line 560c, and the like are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593. Accordingly, the page buffer 593 may be connected to the bit line 560c through the upper bonding metals 571c and 572c and the lower bonding metals 671c and 672c. In an example embodiment, the page buffer 593 may correspond to a page buffer described with reference to FIGS. 1 through 14B. Although not shown in FIG. 15, a page buffer controller described with reference to FIGS. 1 through 14B may be further provided in the bit line bonding area BLBA. For example, the page buffer controller may control page buffers based on different control timings.

In the word line bonding area WLBA, the plurality of word lines 530 may extend in a first direction D1, parallel to the upper surface of the second substrate 510, and may be connected to a plurality of cell contact plugs 541 to 547 (i.e., 540). The plurality of word lines 530 and the plurality of cell contact plugs 540 may be connected to each other via pads provided by at least a portion of the plurality of word lines 530 extending in different lengths in the second direction. A first metal layer 550b and a second metal layer 560b may be sequentially connected to an upper portion of the plurality of cell contact plugs 540 connected to the plurality of word lines 530. The plurality of cell contact plugs 540 may be connected to the peripheral circuit region PERI by the upper bonding metals 571*b* and 572*b* of the cell region CELL and the lower bonding metals 671*b* and 672*b* of the peripheral circuit region PERI in the word line bonding area WLBA.

The plurality of cell contact plugs 540 may be electrically connected to the circuit elements 620*b* providing a row decoder 594 in the peripheral circuit region PERI. In an example embodiment, operating voltages of the circuit elements 620*b* of the row decoder 594 may be different than operating voltages of the circuit elements 620*c* providing the page buffer 593. For example, operating voltages of the circuit elements 620*c* providing the page buffer 593 may be greater than operating voltages of the circuit elements 620*b* providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550*a* and a second metal layer 560*a* may be sequentially stacked on an upper portion of the common source line contact plug 580. For example, an area in which the common source line contact plug 580, the first metal layer 550*a*, and the second metal layer 560*a* are disposed may be defined as the external pad bonding area PA.

Input-output pads 605 and 505 may be disposed in the external pad bonding area PA. A lower insulating film 601 covering a lower surface of the first substrate 610 may be formed below the first substrate 610, and a first input-output pad 605 may be formed on the lower insulating film 601. The first input-output pad 605 may be connected to at least one of the plurality of circuit elements 620*a*, 620*b*, and 620*c* disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 620*a*, 620*b*, and 620*c* disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the third direction (the third direction D3). The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 400 may include only the first input-output pad 605 disposed on the first substrate 610 or the second input-output pad 505 disposed on the second substrate 510. Alternatively, the memory device 400 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673*a*, corresponding to an upper metal pattern 572*a* formed in an uppermost metal layer of the cell region CELL, and having the same cross-sectional shape as the upper metal pattern 572*a* of the cell region CELL so as to be connected to each other, in an uppermost metal layer of the peripheral circuit region PERI. In the peripheral circuit region PERI, the lower metal pattern 673*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671*b* and 672*b* may be formed on the second metal layer 640*b* in the word line bonding area WLBA. In the word line bonding area WLBA, the lower bonding metals 671*b* and 672*b* of the peripheral circuit region PERI may be electrically connected to the upper bonding metals 571*b* and 572*b* of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

In an example embodiment, the memory cell array 210 in FIG. 2 may be arranged in the cell region CELL, and the peripheral circuits PECT in FIG. 2 may be arranged in the peripheral circuit region PERI. For example, the page buffer circuit 220 and the page buffer controller 230, which have been described with reference to FIGS. 1 through 14B, may be arranged in the peripheral circuit region PERI. Accordingly, the memory device 500 may control page buffers, which are adjacent to each other, based on different control timings.

Figure 16:
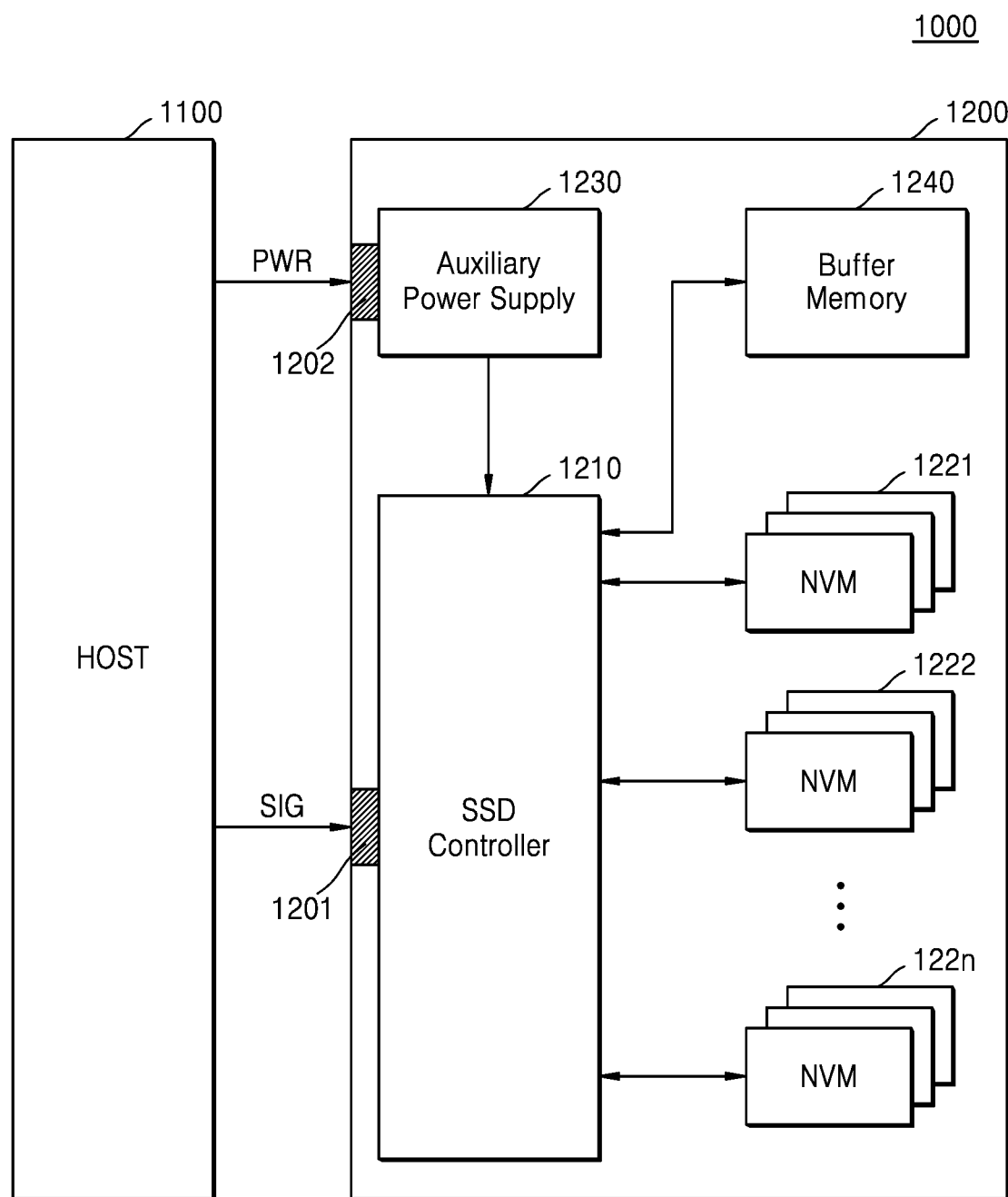
FIG. 16 is a block diagram of a solid state drive (SSD) system using a memory device according to an embodiment.

FIG. 16 is a block diagram of an SSD system using a memory device according to an embodiment. Referring to FIG. 16, an SSD system 1000 may include a host 1100 and an SSD 1200.

The SSD 1200 may exchange signals SIG with the host 1100 through a signal connector 1201 and may receive power PWR through a power connector 1202. The SSD 1200 may include an SSD controller 1210, a plurality of flash memories 1221 through 122*n*, an auxiliary power supply 1230, and a buffer memory 1240. The flash memories 1221 through 122*n* may be connected to the SSD controller 1210 through a plurality of channels, respectively.

The SSD controller 1210 may control the flash memories 1221 through 122*n* in response to a signal SIG received from the host 1100. The SSD controller 1210 may store an internally generated signal or an externally received signal (e.g., the signal SIG received from the host 1100) in the buffer memory 1240. The SSD controller 1210 may correspond to the memory controller 100 described above with reference to FIG. 1.

The flash memories 1221 through 122n may operate under the control of the SSD controller 1210. The auxiliary power supply 1230 is connected to the host 1100 through the power connector 1202. Each of the flash memories 1221 through 122n may correspond to any one of the memory devices 200, 300, 400, and 500 described above with reference to FIGS. 1 through 15. For example, each of the flash memories 1221 through 122n may control page buffers, which are adjacent to each other, based on different control timings.

The auxiliary power supply 1230 may be connected to the host 1100 through the power connector 1202. The auxiliary power supply 1230 may receive the power PWR from the host 1100 and may be charged. The auxiliary power supply 1220 may supply power to the SSD 1200 when power is not smoothly supplied from the host 1100.

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
a cell region including a first metal pad and a memory cell array, the memory cell array including a first memory cell and a second memory cell, the first memory cell being connected to a first word line and a first bit line, and the second memory cell being connected to the first word line and a second bit line; and
a peripheral circuit region including a second metal pad and vertically connected to the cell region by the first metal pad and the second metal pad,
wherein the peripheral circuit region further includes:
a page buffer circuit including a first page buffer and a second page buffer, the first page buffer being connected to the first bit line, and the second page buffer being connected to the second bit line; and
a page buffer controller configured to control the first page buffer and the second page buffer to respectively detect data values respectively stored in the first memory cell and the second memory cell, wherein a develop timing of a first sensing node of the first page buffer is different from a develop timing of a second sensing node of the second page buffer.

2. The nonvolatile memory device of claim 1, wherein the first page buffer is closer to a bonding pad region of the peripheral circuit region than the second page buffer, the bonding pad region having the second metal pad therein.

3. The nonvolatile memory device of claim 1, wherein the first metal pad and the second metal pad formed of copper, and
wherein the first metal pad and the second metal pad are connected by bonding manner.

4. The nonvolatile memory device of claim 1, wherein a develop start point of the second sensing node is earlier than a develop start point of the first sensing node.

5. The nonvolatile memory device of claim 1, wherein a develop start point of the first sensing node is earlier than a develop start point of the second sensing node.

6. The nonvolatile memory device of claim 1, wherein a develop time of the second sensing node is less than a develop time of the first sensing node.

7. The nonvolatile memory device of claim 1, wherein a precharge timing of the first sensing node is different from a precharge timing of the second sensing node.

8. The nonvolatile memory device of claim 1, wherein the first page buffer and the second page buffer are arranged in a line in an extension direction of the first bit line and the second bit line.

9. A nonvolatile memory device comprising:
a cell region including a first metal pad and a memory cell array, the memory cell array including a plurality of memory cells connected in common to a first word line and respectively connected to bit lines; and
a peripheral circuit region including a second metal pad and vertically connected to the cell region by the first metal pad and the second metal pad,
wherein the peripheral circuit region further includes:
page buffers respectively connected to the bit lines; and
a page buffer controller configured to control the page buffers, based on different control timings, to respectively detect data values respectively stored in the plurality of memory cells,
wherein the page buffers are arranged in a line in an extension direction of the bit lines.

10. The nonvolatile memory device of claim 9, wherein a first page buffer among the page buffers is closer to a bonding pad region than a second page buffer among the page buffers, and
a develop timing of a first sensing node of the first page buffer is different from a develop timing of a second sensing node of the second page buffer.

11. The nonvolatile memory device of claim 10, wherein a develop start point of the second sensing node is earlier than a develop start point of the first sensing node.

12. The nonvolatile memory device of claim 10, wherein a develop start point of the first sensing node is earlier than a develop start point of the second sensing node.

13. The nonvolatile memory device of claim 10, wherein a develop time of the second sensing node is less than a develop time of the first sensing node.

14. The nonvolatile memory device of claim 10, wherein a develop time of the first sensing node does not overlap with a develop time of the second sensing node.

15. A nonvolatile memory device comprising:
a cell region including a first metal pad and a memory cell array, the memory cell array including a first memory cell and a second memory cell, the first and second memory cells being connected to a first word line; and
a peripheral circuit region including a second metal pad and vertically connected to the cell region by the first metal pad and the second metal pad,
wherein the peripheral circuit region further includes:
a page buffer circuit including a first page buffer and a second page buffer, the first page buffer being connected to the first memory cell through a first bit line, and the second page buffer being connected to the second memory cell through a second bit line; and
a page buffer controller configured to control the first page buffer and the second page buffer to respectively detect data values respectively stored in the first memory cell and the second memory cell, wherein a develop timing of a first sensing node of the first page buffer is different from a develop timing of a second sensing node of the second page buffer,
wherein the first page buffer is closer to the memory cell array than the second page buffer.

16. The nonvolatile memory device of claim 15, wherein a develop start point of the second sensing node is different from a develop start point of the first sensing node.

17. The nonvolatile memory device of claim 15, wherein a develop time of the first sensing node does not overlap with a develop time of the second sensing node.

18. The nonvolatile memory device of claim 15, wherein a first develop time of the first sensing node partially overlaps with a second develop time of the second sensing node.

19. The nonvolatile memory device of claim 18, wherein the second develop time is less than the first develop time.

20. The nonvolatile memory device of claim 15, wherein the first page buffer and the second page buffer are arranged in a line in an extension direction of the first bit line and the second bit line.

\* \* \* \* \*